United States Patent
Shah et al.

(10) Patent No.: US 8,067,818 B2
(45) Date of Patent: Nov. 29, 2011

(54) NONPLANAR DEVICE WITH THINNED LOWER BODY PORTION AND METHOD OF FABRICATION

(75) Inventors: Uday Shah, Portland, OR (US); Brian Doyle, Portland, OR (US); Justin K. Brask, Portland, OR (US); Robert S. Chau, Beaverton, OR (US); Thomas A. Letson, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 12/954,241

(22) Filed: Nov. 24, 2010

(65) Prior Publication Data

US 2011/0062512 A1  Mar. 17, 2011

Related U.S. Application Data

(62) Division of application No. 10/973,228, filed on Oct. 25, 2004, now abandoned.

(51) Int. Cl.
*H01L 29/06* (2006.01)
(52) U.S. Cl. .................. 257/618; 257/E29.259
(58) Field of Classification Search .......... 257/618, 257/E29.259
See application file for complete search history.

(56) References Cited

U.S. PATENT DOCUMENTS

| | | |
|---|---|---|
| 3,387,820 A | 6/1968 | Sanderfer et al. |
| 4,231,149 A | 11/1980 | Chapman et al. |
| 4,487,652 A | 12/1984 | Almgren |
| 4,711,701 A | 12/1987 | McLevige |
| 4,818,715 A | 4/1989 | Chao |
| 4,905,063 A | 2/1990 | Beltram et al. |
| 4,906,589 A | 3/1990 | Chao |
| 4,907,048 A | 3/1990 | Huang |
| 4,994,873 A | 2/1991 | Madan |
| 4,996,574 A | 2/1991 | Shirasaki et al. |
| 5,023,203 A | 6/1991 | Choi |
| 5,120,666 A | 6/1992 | Gotou |
| 5,124,777 A | 6/1992 | Lee |

(Continued)

FOREIGN PATENT DOCUMENTS

DE 102 03 998 A1 8/2003

(Continued)

OTHER PUBLICATIONS

Auth et al., "Vertical, Fully-Depleted, Surroundings Gate MOSFETS on sub-0.1um Thick Silicon Pillars", 1996 54th Annual Device Research Conference Digest, pp. 108-109 (1996).

(Continued)

*Primary Examiner* — Bradley K Smith
*Assistant Examiner* — Amar Movva
(74) *Attorney, Agent, or Firm* — Blakely, Sokoloff, Taylor & Zafman LLP

(57) ABSTRACT

A nonplanar semiconductor device having a semiconductor body formed on an insulating layer of a substrate. The semiconductor body has a top surface opposite a bottom surface formed on the insulating layer and a pair of laterally opposite sidewalls wherein the distance between the laterally opposite sidewalls at the top surface is greater than at the bottom surface. A gate dielectric layer is formed on the top surface of the semiconductor body and on the sidewalls of the semiconductor body. A gate electrode is formed on the gate dielectric layer on the top surface and sidewalls of the semiconductor body. A pair of source/drain regions are formed in the semiconductor body on opposite sides of the gate electrode.

10 Claims, 7 Drawing Sheets

U.S. PATENT DOCUMENTS

| | | | |
|---|---|---|---|
| 5,179,037 A | 1/1993 | Seabaugh |
| 5,216,271 A | 6/1993 | Takagi et al. |
| 5,218,213 A | 6/1993 | Gaul et al. |
| 5,278,012 A | 1/1994 | Yamanaka et al. |
| 5,308,999 A | 5/1994 | Gotou |
| 5,328,810 A | 7/1994 | Lowrey et al. |
| 5,338,959 A | 8/1994 | Kim et al. |
| 5,346,836 A | 9/1994 | Manning et al. |
| 5,346,839 A | 9/1994 | Sundaresan |
| 5,357,119 A | 10/1994 | Wang et al. |
| 5,391,506 A | 2/1995 | Tada et al. |
| 5,466,621 A | 11/1995 | Hisamoto et al. |
| 5,475,869 A | 12/1995 | Gomi et al. |
| 5,479,033 A | 12/1995 | Baca et al. |
| 5,482,877 A | 1/1996 | Rhee |
| 5,514,885 A | 5/1996 | Myrick |
| 5,521,859 A | 5/1996 | Ema et al. |
| 5,539,229 A | 7/1996 | Noble, Jr et al. |
| 5,543,351 A | 8/1996 | Hirai et al. |
| 5,545,586 A | 8/1996 | Koh et al. |
| 5,563,077 A | 10/1996 | Ha |
| 5,576,227 A | 11/1996 | Hsu |
| 5,578,513 A | 11/1996 | Maegawa |
| 5,595,919 A | 1/1997 | Pan |
| 5,652,454 A | 7/1997 | Iwamatsu et al. |
| 5,658,806 A | 8/1997 | Lin et al. |
| 5,665,203 A | 9/1997 | Lee et al. |
| 5,682,048 A | 10/1997 | Shinohara et al. |
| 5,698,869 A | 12/1997 | Yoshimi et al. |
| 5,701,016 A | 12/1997 | Burroughs et al. |
| 5,716,879 A | 2/1998 | Choi et al. |
| 5,739,544 A | 4/1998 | Yuki et al. |
| 5,760,442 A | 6/1998 | Shigyo et al. |
| 5,770,513 A | 6/1998 | Okaniwa |
| 5,773,331 A | 6/1998 | Solomon et al. |
| 5,776,821 A | 7/1998 | Haskell et al. |
| 5,793,088 A | 8/1998 | Choi et al. |
| 5,804,848 A | 9/1998 | Mukai |
| 5,811,324 A | 9/1998 | Yang |
| 5,814,895 A | 9/1998 | Hirayama et al. |
| 5,821,629 A | 10/1998 | Wen et al. |
| 5,827,769 A | 10/1998 | Aminzadeh et al. |
| 5,844,278 A | 12/1998 | Mizuno et al. |
| 5,856,225 A | 1/1999 | Lee et al. |
| 5,880,015 A | 3/1999 | Hata |
| 5,888,309 A | 3/1999 | Yu |
| 5,889,304 A | 3/1999 | Watanabe et al. |
| 5,899,710 A | 5/1999 | Mukai |
| 5,905,285 A | 5/1999 | Gardner et al. |
| 5,908,313 A | 6/1999 | Chau et al. |
| 5,952,701 A | 9/1999 | Bulucea et al. |
| 5,965,914 A | 10/1999 | Miyamoto |
| 5,976,767 A | 11/1999 | Li |
| 5,985,726 A | 11/1999 | Yu et al. |
| 6,013,926 A | 1/2000 | Oku et al. |
| 6,018,176 A | 1/2000 | Lim |
| 6,031,249 A | 2/2000 | Yamazaki et al. |
| 6,051,452 A | 4/2000 | Shigyo et al. |
| 6,054,355 A | 4/2000 | Inumiya et al. |
| 6,063,675 A | 5/2000 | Rodder |
| 6,066,869 A | 5/2000 | Noble et al. |
| 6,087,208 A | 7/2000 | Krivokapic et al. |
| 6,093,621 A | 7/2000 | Tseng |
| 6,114,201 A | 9/2000 | Wu |
| 6,114,206 A | 9/2000 | Yu |
| 6,117,741 A | 9/2000 | Chatterjee et al. |
| 6,120,846 A | 9/2000 | Hintermaier et al. |
| 6,130,123 A | 10/2000 | Liang et al. |
| 6,144,072 A | 11/2000 | Iwamatsu et al. |
| 6,150,222 A | 11/2000 | Gardner et al. |
| 6,153,485 A | 11/2000 | Pey et al. |
| 6,159,808 A | 12/2000 | Chuang |
| 6,163,053 A | 12/2000 | Kawashima |
| 6,165,880 A | 12/2000 | Yaung et al. |
| 6,174,820 B1 | 1/2001 | Habermehl et al. |
| 6,190,975 B1 | 2/2001 | Kubo et al. |
| 6,200,865 B1 | 3/2001 | Gardner et al. |
| 6,218,309 B1 | 4/2001 | Miller et al. |
| 6,251,729 B1 | 6/2001 | Montree et al. |
| 6,251,751 B1 | 6/2001 | Chu et al. |
| 6,251,763 B1 | 6/2001 | Inumiya et al. |
| 6,252,284 B1 | 6/2001 | Muller et al. |
| 6,259,135 B1 | 7/2001 | Hsu et al. |
| 6,261,921 B1 | 7/2001 | Yen et al. |
| 6,262,456 B1 | 7/2001 | Yu et al. |
| 6,274,503 B1 | 8/2001 | Hsieh |
| 6,287,924 B1 | 9/2001 | Chau et al. |
| 6,294,416 B1 | 9/2001 | Wu |
| 6,307,235 B1 | 10/2001 | Forbes et al. |
| 6,310,367 B1 | 10/2001 | Yagishita et al. |
| 6,317,444 B1 | 11/2001 | Chakrabarti |
| 6,319,807 B1 | 11/2001 | Yeh et al. |
| 6,335,251 B2 | 1/2002 | Miyano et al. |
| 6,358,800 B1 | 3/2002 | Tseng |
| 6,359,311 B1 | 3/2002 | Colinge et al. |
| 6,362,111 B1 | 3/2002 | Laaksonen et al. |
| 6,368,923 B1 | 4/2002 | Huang |
| 6,376,317 B1 | 4/2002 | Forbes et al. |
| 6,383,882 B1 | 5/2002 | Lee et al. |
| 6,387,820 B1 | 5/2002 | Sanderfer |
| 6,391,782 B1 | 5/2002 | Yu |
| 6,396,108 B1 | 5/2002 | Krivokapic et al. |
| 6,399,970 B2 | 6/2002 | Kubo et al. |
| 6,403,434 B1 | 6/2002 | Yu |
| 6,403,981 B1 | 6/2002 | Yu |
| 6,407,442 B2 | 6/2002 | Inoue et al. |
| 6,410,371 B1 | 6/2002 | Yu et al. |
| 6,413,802 B1 | 7/2002 | Hu et al. |
| 6,413,877 B1 | 7/2002 | Annapragada |
| 6,424,015 B1 | 7/2002 | Ishibashi et al. |
| 6,437,550 B2 | 8/2002 | Andoh et al. |
| 6,457,890 B1 | 10/2002 | Kohlruss et al. |
| 6,458,662 B1 | 10/2002 | Yu |
| 6,459,123 B1 | 10/2002 | Enders et al. |
| 6,465,290 B1 | 10/2002 | Suguro et al. |
| 6,472,258 B1 | 10/2002 | Adkisson et al. |
| 6,475,869 B1 | 11/2002 | Yu |
| 6,475,890 B1 | 11/2002 | Yu |
| 6,479,866 B1 | 11/2002 | Xiang |
| 6,483,146 B2 | 11/2002 | Lee |
| 6,483,151 B2 | 11/2002 | Wakabayashi et al. |
| 6,483,156 B1 | 11/2002 | Adkisson et al. |
| 6,495,403 B1 | 12/2002 | Skotnicki et al. |
| 6,498,096 B2 | 12/2002 | Bruce et al. |
| 6,500,767 B2 | 12/2002 | Chiou et al. |
| 6,501,141 B1 | 12/2002 | Leu |
| 6,506,692 B2 | 1/2003 | Andideh |
| 6,515,339 B2 | 2/2003 | Shin et al. |
| 6,525,403 B2 | 2/2003 | Inaba et al. |
| 6,526,996 B1 | 3/2003 | Chang et al. |
| 6,534,807 B2 | 3/2003 | Mandelman et al. |
| 6,537,862 B2 | 3/2003 | Song |
| 6,537,885 B1 | 3/2003 | Kang et al. |
| 6,537,901 B2 | 3/2003 | Cha et al. |
| 6,541,829 B2 | 4/2003 | Nishinohara et al. |
| 6,555,879 B1 | 4/2003 | Krivokapic et al. |
| 6,562,665 B1 | 5/2003 | Yu |
| 6,562,687 B1 | 5/2003 | Deleonibus |
| 6,566,734 B2 | 5/2003 | Sugihara et al. |
| 6,583,469 B1 | 6/2003 | Fried et al. |
| 6,605,498 B1 | 8/2003 | Murthy et al. |
| 6,610,576 B2 | 8/2003 | Nowak |
| 6,611,029 B1 | 8/2003 | Ahmed et al. |
| 6,630,388 B2 | 10/2003 | Sekigawa et al. |
| 6,635,909 B2 | 10/2003 | Clark et al. |
| 6,642,090 B1 | 11/2003 | Fried et al. |
| 6,642,114 B2 | 11/2003 | Nakamura |
| 6,645,797 B1 | 11/2003 | Buynoski et al. |
| 6,645,826 B2 | 11/2003 | Yamazaki et al. |
| 6,645,861 B2 | 11/2003 | Cabral et al. |
| 6,656,853 B2 | 12/2003 | Ito |
| 6,657,259 B2 | 12/2003 | Fried et al. |
| 6,660,598 B2 | 12/2003 | Hanafi et al. |
| 6,664,160 B2 | 12/2003 | Park et al. |
| 6,680,240 B1 | 1/2004 | Maszara |
| 6,686,231 B1 | 2/2004 | Ahmed et al. |
| 6,689,650 B2 | 2/2004 | Gambino et al. |

| | | |
|---|---|---|
| 6,693,324 B2 | 2/2004 | Maegawa et al. |
| 6,696,366 B1 | 2/2004 | Morey et al. |
| 6,706,571 B1 | 3/2004 | Yu et al. |
| 6,709,982 B1 | 3/2004 | Buynoski et al. |
| 6,713,396 B2 | 3/2004 | Anthony |
| 6,716,684 B1 | 4/2004 | Krivokapic et al. |
| 6,716,686 B1 | 4/2004 | Buynoski et al. |
| 6,716,690 B1 | 4/2004 | Wang et al. |
| 6,730,964 B2 | 5/2004 | Horiuchi |
| 6,744,103 B2 | 6/2004 | Synder |
| 6,756,657 B1 | 6/2004 | Zhang et al. |
| 6,762,469 B2 | 7/2004 | Mocuta et al. |
| 6,764,884 B1 | 7/2004 | Yu et al. |
| 6,770,516 B2 | 8/2004 | Wu et al. |
| 6,774,390 B2 | 8/2004 | Sugiyama et al. |
| 6,784,071 B2 | 8/2004 | Chen et al. |
| 6,784,076 B2 | 8/2004 | Gonzalez et al. |
| 6,787,402 B1 | 9/2004 | Yu |
| 6,787,406 B1 | 9/2004 | Hill et al. |
| 6,787,439 B2 | 9/2004 | Ahmed et al. |
| 6,787,845 B2 | 9/2004 | Deleonibus |
| 6,787,854 B1 | 9/2004 | Yang et al. |
| 6,790,733 B1 | 9/2004 | Natzle et al. |
| 6,794,313 B1 | 9/2004 | Chang |
| 6,794,718 B2 | 9/2004 | Nowak et al. |
| 6,798,000 B2 | 9/2004 | Luyken et al. |
| 6,800,885 B1 | 10/2004 | An et al. |
| 6,800,910 B2 | 10/2004 | Lin et al. |
| 6,803,631 B2 | 10/2004 | Dakshina-Murthy et al. |
| 6,812,075 B2 | 11/2004 | Fried et al. |
| 6,812,111 B2 | 11/2004 | Cheong et al. |
| 6,815,277 B2 | 11/2004 | Fried et al. |
| 6,821,834 B2 | 11/2004 | Ando |
| 6,825,506 B2 | 11/2004 | Chau et al. |
| 6,830,998 B1 | 12/2004 | Pan et al. |
| 6,831,310 B1 | 12/2004 | Matthew et al. |
| 6,833,588 B2 | 12/2004 | Yu et al. |
| 6,835,614 B2 | 12/2004 | Hanafi et al. |
| 6,835,618 B1 | 12/2004 | Dakshina-Murthy et al. |
| 6,838,322 B2 | 1/2005 | Pham et al. |
| 6,844,238 B2 | 1/2005 | Yeo et al. |
| 6,849,556 B2 | 2/2005 | Takahashi |
| 6,849,884 B2 | 2/2005 | Clark et al. |
| 6,852,559 B2 | 2/2005 | Kwak et al. |
| 6,855,588 B1 | 2/2005 | Liao et al. |
| 6,855,606 B2 | 2/2005 | Chen et al. |
| 6,855,990 B2 | 2/2005 | Yeo et al. |
| 6,858,472 B2 | 2/2005 | Schoenfeld |
| 6,858,478 B2 | 2/2005 | Chau et al. |
| 6,864,519 B2 | 3/2005 | Yeo et al. |
| 6,864,540 B1 | 3/2005 | Divakaruni et al. |
| 6,867,433 B2 | 3/2005 | Yeo et al. |
| 6,867,460 B1 | 3/2005 | Andreson et al. |
| 6,869,868 B2 | 3/2005 | Chiu et al. |
| 6,869,898 B2 | 3/2005 | Inaki et al. |
| 6,870,226 B2 | 3/2005 | Maede et al. |
| 6,881,635 B1 | 4/2005 | Chidambarrao et al. |
| 6,884,154 B1 | 4/2005 | Mizushima et al. |
| 6,885,055 B2 | 4/2005 | Lee |
| 6,888,199 B2 | 5/2005 | Nowak et al. |
| 6,890,811 B2 | 5/2005 | Hou et al. |
| 6,891,234 B1 | 5/2005 | Connelly et al. |
| 6,897,527 B2 | 5/2005 | Dakshina-Murthy et al. |
| 6,902,947 B2 | 6/2005 | Chinn et al. |
| 6,902,962 B2 | 6/2005 | Yeo et al. |
| 6,909,147 B2 | 6/2005 | Aller et al. |
| 6,909,151 B2 | 6/2005 | Hareland et al. |
| 6,919,238 B2 | 7/2005 | Bohr |
| 6,921,691 B1 | 7/2005 | Li et al. |
| 6,921,702 B2 | 7/2005 | Ahn et al. |
| 6,921,963 B2 | 7/2005 | Krivokapic et al. |
| 6,921,982 B2 | 7/2005 | Joshi et al. |
| 6,924,190 B2 | 8/2005 | Dennison |
| 6,946,377 B2 | 9/2005 | Chambers |
| 6,955,969 B2 | 10/2005 | Djomehri et al. |
| 6,960,517 B2 | 11/2005 | Rios et al. |
| 6,967,351 B2 | 11/2005 | Fried et al. |
| 6,969,878 B2 | 11/2005 | Coronel et al. |
| 6,974,738 B2 | 12/2005 | Hareland |
| 6,975,014 B1 | 12/2005 | Krivokapic et al. |
| 6,977,415 B2 | 12/2005 | Matsuo |
| 6,998,301 B1 | 2/2006 | Yu et al. |
| 6,998,318 B2 | 2/2006 | Park |
| 7,018,551 B2 | 3/2006 | Beintner et al. |
| 7,045,401 B2 | 5/2006 | Lee et al. |
| 7,045,407 B2 | 5/2006 | Keating et al. |
| 7,045,441 B2 | 5/2006 | Chang et al. |
| 7,045,451 B2 | 5/2006 | Shenai-Khatkhate et al. |
| 7,049,654 B2 | 5/2006 | Chang |
| 7,056,794 B2 | 6/2006 | Ku et al. |
| 7,060,539 B2 | 6/2006 | Chidambarrao et al. |
| 7,061,055 B2 | 6/2006 | Sekigawa et al. |
| 7,071,064 B2 | 7/2006 | Doyle et al. |
| 7,074,623 B2 | 7/2006 | Lochtefeld et al. |
| 7,074,656 B2 | 7/2006 | Yeo |
| 7,074,662 B2 | 7/2006 | Lee et al. |
| 7,084,018 B1 | 8/2006 | Ahmed et al. |
| 7,105,390 B2 | 9/2006 | Brask et al. |
| 7,105,891 B2 | 9/2006 | Visokay |
| 7,105,894 B2 | 9/2006 | Yeo et al. |
| 7,105,934 B2 | 9/2006 | Anderson et al. |
| 7,112,478 B2 | 9/2006 | Grupp et al. |
| 7,115,954 B2 | 10/2006 | Shimizu et al. |
| 7,119,402 B2 | 10/2006 | Kinoshita et al. |
| 7,122,463 B2 | 10/2006 | Ohuchi |
| 7,132,360 B2 | 11/2006 | Schaefer et al. |
| 7,138,320 B2 | 11/2006 | Bentum et al. |
| 7,141,480 B2 | 11/2006 | Adam et al. |
| 7,141,856 B2 | 11/2006 | Lee et al. |
| 7,154,118 B2 | 12/2006 | Lindert |
| 7,163,851 B2 | 1/2007 | Adadeer et al. |
| 7,172,943 B2 | 2/2007 | Yeo et al. |
| 7,183,137 B2 | 2/2007 | Lee et al. |
| 7,187,043 B2 | 3/2007 | Arai et al. |
| 7,196,372 B1 | 3/2007 | Yu et al. |
| 7,238,564 B2 | 7/2007 | Ko et al. |
| 7,241,653 B2 | 7/2007 | Hareland et al. |
| 7,247,547 B2 | 7/2007 | Zhu et al. |
| 7,247,578 B2 | 7/2007 | Brask |
| 7,250,645 B1 | 7/2007 | Wang et al. |
| 7,250,655 B2 | 7/2007 | Bae et al. |
| 7,256,455 B2 | 8/2007 | Ahmed et al. |
| 7,268,024 B2 | 9/2007 | Yeo et al. |
| 7,268,058 B2 | 9/2007 | Chau et al. |
| 7,291,886 B2 | 11/2007 | Doris et al. |
| 7,297,600 B2 | 11/2007 | Oh et al. |
| 7,304,336 B2 | 12/2007 | Cheng et al. |
| 7,323,710 B2 | 1/2008 | Kim et al. |
| 7,326,634 B2 | 2/2008 | Lindert et al. |
| 7,329,913 B2 | 2/2008 | Brask et al. |
| 7,348,284 B2 | 3/2008 | Doyle et al. |
| 7,354,817 B2 | 4/2008 | Watanabe et al. |
| 7,358,121 B2 | 4/2008 | Chau et al. |
| 7,385,262 B2 | 6/2008 | O'Keefee et al. |
| 7,396,730 B2 | 7/2008 | Li |
| 2001/0019886 A1 | 9/2001 | Bruce et al. |
| 2001/0026985 A1 | 10/2001 | Kim et al. |
| 2001/0040907 A1 | 11/2001 | Chakrabarti |
| 2002/0011612 A1 | 1/2002 | Hieda |
| 2002/0036290 A1 | 3/2002 | Inaba et al. |
| 2002/0037619 A1 | 3/2002 | Sugihara et al. |
| 2002/0048918 A1 | 4/2002 | Grider et al. |
| 2002/0058374 A1 | 5/2002 | Kim |
| 2002/0074614 A1 | 6/2002 | Furuta et al. |
| 2002/0081794 A1 | 6/2002 | Ito |
| 2002/0096724 A1 | 7/2002 | Liang et al. |
| 2002/0142529 A1 | 10/2002 | Matsuda et al. |
| 2002/0149031 A1 | 10/2002 | Kim et al. |
| 2002/0160553 A1 | 10/2002 | Yamanaka et al. |
| 2002/0166838 A1 | 11/2002 | Nagarajan |
| 2002/0167007 A1 | 11/2002 | Yamazaki et al. |
| 2002/0177263 A1 | 11/2002 | Hanafi et al. |
| 2002/0177282 A1 | 11/2002 | Song |
| 2003/0036290 A1 | 2/2003 | Hsieh et al. |
| 2003/0042542 A1 | 3/2003 | Maegawa et al. |
| 2003/0057477 A1 | 3/2003 | Hergenrother et al. |
| 2003/0057486 A1 | 3/2003 | Gambino |
| 2003/0067017 A1 | 4/2003 | Ieong et al. |

| | | |
|---|---|---|
| 2003/0085194 A1 | 5/2003 | Hopkins, Jr. |
| 2003/0098479 A1 | 5/2003 | Murthy et al. |
| 2003/0098488 A1 | 5/2003 | O'Keeffe et al. |
| 2003/0102497 A1 | 6/2003 | Fried et al. |
| 2003/0102518 A1 | 6/2003 | Fried et al. |
| 2003/0111686 A1 | 6/2003 | Nowak |
| 2003/0122186 A1 | 7/2003 | Sekigawa et al. |
| 2003/0143791 A1 | 7/2003 | Cheong et al. |
| 2003/0151077 A1 | 8/2003 | Mathew et al. |
| 2003/0174534 A1 | 9/2003 | Clark et al. |
| 2003/0186167 A1 | 10/2003 | Johnson, Jr. et al. |
| 2003/0190766 A1 | 10/2003 | Gonzalez et al. |
| 2003/0201458 A1 | 10/2003 | Clark et al. |
| 2003/0227036 A1 | 12/2003 | Sugiyama et al. |
| 2004/0016968 A1 | 1/2004 | Coronel et al. |
| 2004/0029323 A1 | 2/2004 | Shimizu et al. |
| 2004/0029345 A1 | 2/2004 | Deleonibus et al. |
| 2004/0029393 A1 | 2/2004 | Ying et al. |
| 2004/0031979 A1 | 2/2004 | Lochtefeld et al. |
| 2004/0033639 A1 | 2/2004 | Chinn et al. |
| 2004/0036118 A1 | 2/2004 | Abadeer et al. |
| 2004/0036126 A1 | 2/2004 | Chau et al. |
| 2004/0036127 A1 | 2/2004 | Chau et al. |
| 2004/0038436 A1 | 2/2004 | Mori et al. |
| 2004/0038533 A1 | 2/2004 | Liang |
| 2004/0061178 A1 | 4/2004 | Lin et al. |
| 2004/0063286 A1 | 4/2004 | Kim et al. |
| 2004/0070020 A1 | 4/2004 | Fujiwara et al. |
| 2004/0075149 A1 | 4/2004 | Fitzgerald et al. |
| 2004/0082125 A1 | 4/2004 | Hou et al. |
| 2004/0092062 A1 | 5/2004 | Ahmed et al. |
| 2004/0092067 A1 | 5/2004 | Hanafi et al. |
| 2004/0094807 A1 | 5/2004 | Chau et al. |
| 2004/0099903 A1 | 5/2004 | Yeo et al. |
| 2004/0099966 A1 | 5/2004 | Chau et al. |
| 2004/0108523 A1 | 6/2004 | Chen et al. |
| 2004/0108558 A1 | 6/2004 | Kwak et al. |
| 2004/0110097 A1 | 6/2004 | Ahmed et al. |
| 2004/0119100 A1 | 6/2004 | Nowak et al. |
| 2004/0124492 A1 | 7/2004 | Matsuo |
| 2004/0126975 A1 | 7/2004 | Ahmed et al. |
| 2004/0132236 A1 | 7/2004 | Doris et al. |
| 2004/0132567 A1 | 7/2004 | Schonnenbeck |
| 2004/0145000 A1 | 7/2004 | An et al. |
| 2004/0145019 A1 | 7/2004 | Dakshina-Murthy et al. |
| 2004/0166642 A1 | 8/2004 | Chen et al. |
| 2004/0169221 A1 | 9/2004 | Ko et al. |
| 2004/0173815 A1 | 9/2004 | Yeo et al. |
| 2004/0173846 A1 | 9/2004 | Hergenrother et al. |
| 2004/0180491 A1 | 9/2004 | Arai et al. |
| 2004/0191980 A1 | 9/2004 | Rios et al. |
| 2004/0195624 A1 | 10/2004 | Liu et al. |
| 2004/0197975 A1 | 10/2004 | Krivokapic et al. |
| 2004/0198003 A1 | 10/2004 | Yeo et al. |
| 2004/0203254 A1 | 10/2004 | Conley et al. |
| 2004/0209463 A1 | 10/2004 | Kim et al. |
| 2004/0217420 A1 | 11/2004 | Yeo et al. |
| 2004/0219722 A1 | 11/2004 | Pham et al. |
| 2004/0219780 A1 | 11/2004 | Ohuchi |
| 2004/0222473 A1 | 11/2004 | Risaki |
| 2004/0227187 A1 | 11/2004 | Cheng et al. |
| 2004/0238887 A1 | 12/2004 | Nihey |
| 2004/0238915 A1 | 12/2004 | Chen et al. |
| 2004/0253792 A1 | 12/2004 | Cohen et al. |
| 2004/0256647 A1 | 12/2004 | Lee et al. |
| 2004/0262683 A1 | 12/2004 | Bohr et al. |
| 2004/0262699 A1 | 12/2004 | Rios et al. |
| 2005/0017377 A1 | 1/2005 | Joshi et al. |
| 2005/0019993 A1 | 1/2005 | Lee |
| 2005/0020020 A1 | 1/2005 | Collaert et al. |
| 2005/0035391 A1 | 2/2005 | Lee et al. |
| 2005/0035415 A1 | 2/2005 | Yeo et al. |
| 2005/0040444 A1 | 2/2005 | Cohen |
| 2005/0059214 A1 | 3/2005 | Cheng et al. |
| 2005/0073060 A1 | 4/2005 | Datta et al. |
| 2005/0093028 A1 | 5/2005 | Chambers |
| 2005/0093067 A1 | 5/2005 | Yeo et al. |
| 2005/0093075 A1 | 5/2005 | Bentum et al. |
| 2005/0093154 A1 | 5/2005 | Kottantharayil et al. |
| 2005/0104055 A1 | 5/2005 | Kwak et al. |
| 2005/0104096 A1 | 5/2005 | Lee et al. |
| 2005/0110082 A1 | 5/2005 | Cheng |
| 2005/0116289 A1 | 6/2005 | Boyd et al. |
| 2005/0118790 A1 | 6/2005 | Lee et al. |
| 2005/0127362 A1 | 6/2005 | Zhang et al. |
| 2005/0127632 A1 | 6/2005 | Gehre |
| 2005/0133866 A1 | 6/2005 | Chau et al. |
| 2005/0136584 A1 | 6/2005 | Boyanov et al. |
| 2005/0139860 A1 | 6/2005 | Synder et al. |
| 2005/0145894 A1 | 7/2005 | Chau et al. |
| 2005/0145941 A1 | 7/2005 | Bedell et al. |
| 2005/0145944 A1 | 7/2005 | Murthy et al. |
| 2005/0148131 A1 | 7/2005 | Brask |
| 2005/0148137 A1 | 7/2005 | Brask et al. |
| 2005/0153494 A1 | 7/2005 | Ku et al. |
| 2005/0156171 A1 | 7/2005 | Brask et al. |
| 2005/0156202 A1 | 7/2005 | Rhee et al. |
| 2005/0156227 A1 | 7/2005 | Jeng |
| 2005/0161739 A1 | 7/2005 | Anderson et al. |
| 2005/0167766 A1 | 8/2005 | Yagishita |
| 2005/0170593 A1 | 8/2005 | Kang et al. |
| 2005/0184316 A1 | 8/2005 | Kim |
| 2005/0189583 A1 | 9/2005 | Kim et al. |
| 2005/0191795 A1 | 9/2005 | Chidambarrao et al. |
| 2005/0199919 A1 | 9/2005 | Liu |
| 2005/0215014 A1 | 9/2005 | Ahn et al. |
| 2005/0215022 A1 | 9/2005 | Adam et al. |
| 2005/0224797 A1 | 10/2005 | Ko et al. |
| 2005/0224798 A1 | 10/2005 | Buss |
| 2005/0224800 A1 | 10/2005 | Lindert et al. |
| 2005/0227498 A1 | 10/2005 | Furkawa |
| 2005/0230763 A1 | 10/2005 | Huang et al. |
| 2005/0233156 A1 | 10/2005 | Senzaki |
| 2005/0239252 A1 | 10/2005 | Ahn et al. |
| 2005/0255642 A1 | 11/2005 | Liu |
| 2005/0266645 A1 | 12/2005 | Park |
| 2005/0272192 A1 | 12/2005 | Oh et al. |
| 2005/0277294 A1 | 12/2005 | Schaeffer et al. |
| 2005/0280121 A1 | 12/2005 | Doris et al. |
| 2006/0014338 A1 | 1/2006 | Doris et al. |
| 2006/0040054 A1 | 2/2006 | Pearlstein et al. |
| 2006/0046521 A1 | 3/2006 | Vaartstra et al. |
| 2006/0063469 A1 | 3/2006 | Talieh et al. |
| 2006/0068590 A1 | 3/2006 | Lindert et al. |
| 2006/0068591 A1 | 3/2006 | Radosavljevic et al. |
| 2006/0071299 A1 | 4/2006 | Doyle et al. |
| 2006/0086977 A1 | 4/2006 | Shah et al. |
| 2006/0138548 A1 | 6/2006 | Richards et al. |
| 2006/0154478 A1 | 7/2006 | Hsu et al. |
| 2006/0172480 A1 | 8/2006 | Wang et al. |
| 2006/0202270 A1 | 9/2006 | Son et al. |
| 2006/0205164 A1 | 9/2006 | Ko et al. |
| 2006/0211184 A1 | 9/2006 | Boyd et al. |
| 2006/0227595 A1 | 10/2006 | Chuang et al. |
| 2006/0240622 A1 | 10/2006 | Lee et al. |
| 2006/0263699 A1 | 11/2006 | Abatchev et al. |
| 2006/0281325 A1 | 12/2006 | Chou et al. |
| 2007/0001219 A1 | 1/2007 | Radosavljevic et al. |
| 2007/0023795 A1 | 2/2007 | Nagano et al. |
| 2007/0045748 A1 | 3/2007 | Booth et al. |
| 2007/0048930 A1 | 3/2007 | Figura et al. |
| 2007/0093010 A1 | 4/2007 | Mathew et al. |
| 2007/0108514 A1 | 5/2007 | Inoue et al. |
| 2007/0241414 A1 | 10/2007 | Narihiro |
| 2007/0262389 A1 | 11/2007 | Chau et al. |

FOREIGN PATENT DOCUMENTS

| | | |
|---|---|---|
| EP | 0 623 963 A1 | 11/1994 |
| EP | 1 091 413 A2 | 4/2001 |
| EP | 1 202 335 A2 | 5/2002 |
| EP | 1 566 844 A2 | 8/2005 |
| GB | 2 156 149 A | 10/1985 |
| JP | 56073454 | 6/1981 |
| JP | 59145538 A | 8/1984 |
| JP | 02 303048 A | 12/1990 |
| JP | 0600 5856 | 1/1994 |
| JP | 06-151387 A | 5/1994 |
| JP | 06 177089 A | 6/1994 |

| | | |
|---|---|---|
| JP | 06224440 A | 8/1994 |
| JP | 7-50421 A | 2/1995 |
| JP | 09-162301 A | 6/1997 |
| JP | 2000 037842 A | 2/2000 |
| JP | 2001 338987 | 12/2001 |
| JP | 2002-110977 A | 12/2002 |
| JP | 2003-298051 | 10/2003 |
| KR | 10 0222363 | 10/1999 |
| TW | 2004 14538 | 8/1992 |
| TW | 2005 18310 | 11/1998 |
| TW | 508669 | 11/2002 |
| TW | 516232 | 1/2003 |
| TW | 561530 | 1/2003 |
| TW | 546713 | 8/2003 |
| TW | 548799 | 8/2003 |
| TW | 2004 02872 | 2/2004 |
| TW | 2004 05408 | 4/2004 |
| TW | 591798 | 6/2004 |
| TW | 594990 | 6/2004 |
| TW | 2004 14539 | 8/2004 |
| TW | 2004 17034 | 9/2004 |
| TW | I223449 | 11/2004 |
| TW | I231994 | 5/2005 |
| TW | I238524 | 8/2005 |
| TW | I239102 | 9/2005 |
| WO | WO 02/43151 A1 | 5/2002 |
| WO | WO 02/095814 | 11/2002 |
| WO | WO 03/003442 | 1/2003 |
| WO | WO 2004/059726 A1 | 7/2004 |
| WO | WO 2005/034212 A2 | 4/2005 |
| WO | WO 2005/036651 A1 | 4/2005 |
| WO | WO 2005/098963 A1 | 10/2005 |
| WO | WO 2006/007350 A1 | 1/2006 |
| WO | WO 2006/078469 A1 | 7/2006 |
| WO | WO 2007/002426 A2 | 1/2007 |
| WO | WO 2007/041152 A1 | 4/2007 |

OTHER PUBLICATIONS

Breed, A., et al., "Dual-gate (FinFET) and tri-gate MOSFETs: simulation and design", Semiconductor Device Research Symposium, 2003 International, Dec. 10-12, 2003, pp. 150-151, Added Dec. 2009.

Buchanan, D. A., et al., "Fabrication of Midgap Metal Gates Compatible with Ultrathin Dielectrics," Applied Physics Letters, 73.12, (Sep. 21, 1998), pp. 1676-1678.

Burenkov, A. et al., "Corner Effect in Double and Triple Gate FINFETs", European Solid-State Device Research, 2003 33rd Conference on Essderc '03 Sep. 2003, Piscataway, NJ, USA, IEEE, pp. 135-138.

Chang, L., et al., "CMOS Circuit Performance Enhancement by Surface Orientation Optimization," IEEE Transactions on Electron Devices, IEEE Service Center, Piscataway, NJ, vol. 51, No. 10, Oct. 2004, pp. 1621-1627.

Chang, S.T. et al, "3-D Simulation of Strained Si/SiGe Heterojunction FinFETS", Semiconductor Device Research Symposium, 2003 International, Dec. 2003, Piscataway, NJ, USA, IEEE, pp. 176-177.

Chau, R., "Advanced Metal Gate/High-K Dielectric Stacks for High-Performance CMOS Transistors", Proceedings of AVS 5th International Conference of Microelectronics and Interfaces, Mar. 2004, (3 pgs.).

Chau, Robert et al., Advanced Depleted-Substrate Transistors: Single-gate, Double-gate and Tri-gate (Invited Paper), Components Research, Logic Technology Development, Intel Corporation, Hillsboro, OR, (2 pgs.).

Choi, Yang-Kyu et al., "A Spacer Patterning Technology for Nanoscale CMOS," IEEE Transactions on Electron Devices, vol. 49, No. 3, Mar. 2002, pp. 436-441.

Choi, Yang-Kyu et al., "Sub-20nm CMOS FinFET Technologies", Department of Electrical Engineering and Computer Sciences, University of California, Berkeley, CA 94720, USA, email: ykchoi@eecs.berkeley.edu, Tel: +1-510-643-2558, pp. 19.1.1-19.1.4.

Claflin, B., et al., "Interface Studies of Tungsten Nitride and Titanium Nitride Composite Metal Gate Electrodes with Thin Dielectric Layers," Journal of Vacuum Science and Technology A 16.3, (May/Jun. 1998), pp. 1757-1761.

Collaert, N. et al. "A Functional 41-Stage ring oscillator using scaled FinFET devices with 25-nm gate lengths and 10-nm fin widths applicable for the 45-nm CMOS node" IEEE Electron Device Letters, vol. 254, No. 8 (Aug. 2004), pp. 568-570.

Fried, David M. et al., "High-Performance P-Type Independent-Gate FinFETs," IEEE Electron Device Letters, vol. 25, No. 4, Apr. 2004, pp. 199-201.

Fried, David M. et al., "Improved Independent Gate N-Type FinFET Fabrication and Characterization", IEEE Electron Device Letters, vol. 24, No. 9, Sep. 2003, pp. 592-594.

Guo, Jing et al., "Performance Projections for Ballistic Carbon Nanotube Field-Effect Transistors," Applied Physics Letters, vol. 80, No. 17, Apr. 29, 2002, pp. 2192-2194.

Hisamoto et al., "A Folded-channel MOSFET for Deep-sub-tenth Micron Era", 1998 IEEE International Electron Device Meeting Techincal Digest, pp. 1032-1034 (1998).

Hisamoto et al., "A Fully Depleted Lean-Channel Transistor (DELTA)—A Novel Vertical Ultrathin SOI MOSFET", IEEE Electron Device Letters, (1990) V. 11(1), pp. 36-38.

Hisamoto, Digh et al. "FinFET—A Self-Aligned Double-Gate MOSFET Scalable to 20 nm", IEEE Transactions on Electron Devices, vol. 47, No. 12, Dec. 2000, pp. 2320-2325.

Huang et al., "Sub 50-nm FinFET: PMOS", 1999 IEEE International Electron Device Meeting Technical Digest, (1999) pp. 67-70.

Hwang, Jeong-Mo et al., "Novel Polysilicon/Tin Stacked-Gate Structure for Fully-Depleted SOI/CMOS," International Electronic Devices Meeting Technical Digest, (1992), pp. 345-348.

Ieong, M. et al., Three Dimensional CMOS Devices and Integrated Circuits, IEEE 2003 CICC, San Jose, CA, Sep. 21-24, 2003, pp. 207-214.

Javey, Ali et al., "Ballistic Carbon Nanotube Field-Effect Transistors", Nature, vol. 424, Aug. 7, 2003, pp. 654-657.

Javey, Ali et al., "High-K Dielectrics for Advanced Carbon-Nanotube Transistors and Logic Gates", Advance Online Publication, Published online, Nov. 17, 2002, pp. 1-6.

Jin, B. et al., "Mobility Enhancement in Compressively Strained SIGE Surface Channel PMOS Transistors with HF02/TIN Gate Stack", Proceedings of the First Joint International Symposium, 206th Meeting of Electrochemical Society, Oct. 2004, pp. 111-122.

Jones, E. C., "Doping Challenges in Exploratory Devices for High Performance Logic", 14th Int'l. Conference, Piscataway, NJ, Sep. 22-27, 2002, pp. 1-6.

Kim, Sung Min, et al., A Novel Multi-Channel Field Effect Transistor (McFET) on Bulk Si for High Performance Sub-80nm Application, IEDM 04-639, 2004 IEEE, pp. 27.4.1-27.4.4.

Kuo, Charles et al. "A Capacitorless Double Gate DRAM Technology for Sub-100-nm Embedded and Stand-Alone Memory Applications," IEEE Transactions on Electron Devices, vol. 50, No. 12, Dec. 2003, pp. 2408-2416.

Kuo, Charles et al., "A Capacitorless Double-Gate DRAM Cell Design for High Density Applications", 2002 IEEE International Electron Devices Meeting Techincal Digest, Dec. 2002, pp. 843-843.

Lide, David R. "Properties of Semiconductors" CRC Handbook of Chemistry and Physics, internet version 2007, (87th edition), David R. Lide—Editor; Taylor and Francis, pp. 12-77-12-89.

Ludwig et al., "FinFET Technology for Future Microprocessors" 2003 IEEE, pp. 33-34.

Martel, Richard et al., "Carbon Nanotube Field Effect Transistors for Logic Applications" IBM, T.J. Watson Research Center, 2001 IEEE, IEDM 01, pp. 159-162.

Mayer, T.M., et al., "Chemical Vapor Deposition of Fluoroalkylsilane Monolayer Films for Adhesion Control in Microelectromechanical Systems" 2000 American Vacuum Society B 18(5), Sep./Oct. 2000, pp. 2433-2440.

Nackaerts et al., "A 0.314 µm$^2$ 6T-SRAM Cell build with Tall Triple-Gate Devices for 45nm node applications using 0.75NA 193nm lithography," IDEM, (Dec. 13, 2004), pp. 269-272.

Nowak, E. J., et al., "A Functional FinFET-DGCMOS SRAM Cell", Int'l Electron Devices Meeting 2002, San Francisco, CA, Dec. 8-11, 2002, pp. 411-414.

Nowak, E. J., et al., "Scaling Beyond the 65 nm Node with FinFET-DGCOMS", IEEE 2003 CICC, San Jose, CA, Sep. 21-24, 2003, pp. 339-342.

Nowak, Edward J. et al., "Turning Silicon on Its Edge . . . ," IEEE Circuits & Devices magazine, vol. 1, (Jan./Feb. 2004), pp. 20-31.
Ohsawa, Takashi et al., "Memory Design Using a One-Transistor Gain Cell on SOI", IEEE Journal of Solid-State Circuits, vol. 37, No. 11, Nov. 2002, pp. 1510-1522.
Park, Donggun et al., "3-Dimensional nano-CMOS Transistors to Overcome Scaling Limits," IEEE 2004, ISBN 0-7803-8511-X, (Oct. 18, 2004), pp. 35-40.
Park, Jae-Hyoun et al., "Quantum-wired MOSFET Photodetector Fabricated by Conventional Photolithography on SOI Substrate," Nanotechnology, 2004, 4th IEEE Conference on, Munich, Germany, Aug. 16-19, 2004, Piscataway, NJ, pp. 425-427.
Park, Jong-Tae, et al., "Pi-Gate SOI MOSFET". IEEE Electron Device Letters, vol. 22, No. 8, Aug. 2001, pp. 405-406.
Park, T. et al., "PMOS Body-Tied FinFET (Omega MOSFET) Characteristics", Device Research Conference, Piscataway, NJ, Jun. 23-25, 2003, IEEE Jun. 2003, pp. 33-34.
Park, T. et al., "Fabrication of Body-Tied FinFETs (Omega MOSFETs) Using Bulk Si Wafers", 2003 Symposia on VLSI Technology Digest of Technical Papers, Jun. 2003, pp. 135-136.
Seevinck, Evert et al., "Static-Noise Margin Analysis of MOS SRAM Cells" 1987 IEEE, IEEE Journal of Solid-State Circuits, vol. SC-22, No. 5, Oct. 1987.
Stadele et al., "A Comprehensive Study of Corner Effects in Tri-gate Transistors," IEEE 2004, pp. 165-168.
Stolk, Peter A. et al., "Modeling Statistical Dopant Fluctuations in MOS Transistors", 1998 IEEE, IEEE Transactions on Electron Devices, vol. 45, No. 9, Sep. 1998, pp. 1960-1971.
Subramanian, V., et al., "A Bulk-Si-Compatible Ultrathin-body SOI Technology for sub-100nm MOSFETs" Proceeding of the 57th Annual Device Research Conference, (1999) pp. 28-29.
Sugizaki, T. et al., "Novel Multi-bit SONOS Type Flash Memory Using a High-k Charge Trapping Layer," VLSI Technology, 2003, Digest of Technical Papers, Symposiom on, Jun. 10-12, 2003, (2003), pp. 27-28.
Tanaka, T. et al., Scalability Study on a Capacitorless 1T-DRAM: From Single-gate PD- SOI to Double-Gate FinDRAM, 2004 IEEE International Electron Devices Meeting Technical Digest, Dec. 2004, (4 pgs.).
Tang, Stephen H. et al., "FinFET—A quasi-planar double-gate MOSFET", 2001 IEEE International Solid-State Circuits Conference (Feb. 6, 2001), pp. 1-3.
Tokoro, Kenji et al., "Anisotropic Etching Properties of Silicon in KOH and TMAH Solutions," International Symposium on Micromechatronics and Human Science, IEEE (1998), pp. 65-70.
Wolf, Stanley et al., "Wet Etching Silicon," Silicon Processing for the VLSI Era, vol. 1: Process Technology, Lattice Press, Sunset Beach, CA, (Sep. 1986), (3 pgs.).
Xiong, W., et al., "Corner Effect in Multiple-Gate SOI MOSFETs" 2003 IEEE, pp. 111-113.
Xiong, Weize et al., "Improvement of FinFET Electrical Characteristics by Hydrogen Annealing," IEEE Electron Device Letters, vol. 25, No. 8, Aug. 2004, pp. 541-543.

Yang, Fu-Liang et al., "25nm CMOS Omega FETs" IEEE 2002, 10.3.1-10-.3.4, pp. 255-258.
Yang, Fu-Liang, et al., "5nm-Gate Nanowire FinFET," 2004 Symposium on VLSI Technology Digest of Technical Papers, 2004 IEEE, pp. 196-197.
Taiwan IPO Search Report for Application No. TW 094136197, mailed May 15, 2008, 4 pgs.
International Search Report for PCT/US2003/026242, mailed Jan. 26, 2004, 8 pgs.
International Search Report for PCT/US2003/039727, mailed Apr. 27, 2004, 6 pgs.
International Search Report for PCT/US2003/040320, mailed Jun. 2, 2004, 7 pgs.
International Search Report for PCT/US2005/000947, mailed May 3, 2005, 7 pgs.
International Search Report and Written Opinion for PCT/US2005/010505, mailed Aug. 26, 2005, 24 pgs.
International Search Report and Written Opinion for PCT/US2005/020339, mailed Oct. 4, 2005, 20 pgs.
International Search Report for PCT/US2005/033439, mailed Jan. 31, 2006, 7 pgs.
International Search Report and Written Opinion for PCT/US2005/035380, mailed Feb. 13, 2006, 14 pgs.
International Search Report and Written Opinion for PCT/US2004/032442, mailed Jun. 16, 2005, 22 pgs.
International Search Report and Written Opinion for PCT/US2005/037169, mailed Feb. 23, 2006, 11 pgs.
International Search Report and Written Opinion for PCT/US2006/000378, mailed May 24, 2006, 11 pgs.
International Search Report and Written Opinion for PCT/US2006/024516, mailed Jan. 17, 2007, 18 pgs.
International Search Report for PCT/US2006/037643, mailed Jan. 24, 2007, 4 pgs.
Intel Corporation Office Action for U.S. Appl. No. 10/973,228 mailed Aug. 24, 2010.
Intel Corporation Office Action for U.S. Appl. No. 10/973,228 mailed Feb. 20, 2010.
Intel Corporation Office Action for U.S. Appl. No. 10/973,228 mailed Sep. 15, 2010.
Intel Corporation Office Action for U.S. Appl. No. 10/973,228 mailed Mar. 5, 2009.
Intel Corporation Office Action for U.S. Appl. No. 10/973,228 mailed Oct. 3, 2008.
Intel Corporation Office Action for U.S. Appl. No. 10/973,228 mailed May 6, 2008.
Intel Corporation Office Action for U.S. Appl. No. 10/973,228 mailed Jan. 7, 2008.
Intel Corporation Office Action for U.S. Appl. No. 10/973,228 mailed Jun. 13, 2007.
Intel Corporation Office Action for U.S. Appl. No. 10/973,228 mailed Jan. 25, 2007.
Intel Corporation Office Action for U.S. Appl. No. 10/973,228 mailed Jun. 26, 2006.

NONPLANAR DEVICE WITH THINNED LOWER BODY PORTION AND METHOD OF FABRICATION

This is a Divisional application of Ser. No. 10/973,228 filed Oct. 25, 2004 now abandoned, which is presently pending.

BACKGROUND OF THE INVENTION

1 Field of the Invention

The present invention relates to the field of semiconductor devices and more particularly to a nonplanar tri-gate transistor having a thinned lower body portion and method of fabrication.

2 Discussion of Related Art

In order to increase the performance of modern integrated circuits, such as microprocessors, silicon on insulator (SOI) transistors have been proposed. Silicon on insulator (SOI) transistors have an advantage in that they can be operated in a fully depleted manner. Fully depleted transistors have an advantage of ideal subthreshold gradients for optimized ON current/OFF current ratios.

An example of a proposed SOI transistor which can be operated in a fully depleted manner is a tri-gate transistor 100, such as illustrated in FIG. 1. Tri-gate transistor 100 includes a silicon body 104 formed on an insulating substrate 102 having a buried oxide layer 103 formed on a monocrystalline silicon substrate 105. A gate dielectric layer 106 is formed on the top and sidewalls of the silicon body 104 as shown in FIG. 1. A gate electrode 108 is formed on the gate dielectric layer and surrounds the body 104 on three sides, essentially providing a transistor 100 having three gate electrodes ($G_1$, $G_2$, $G_3$), one on each of the sidewalls of the silicon body 104 and one on the top surface of the silicon body 104. A source region 110 and a drain region 112 are formed in the silicon body 104 on opposite sides of the gate electrode 108 as shown in FIG. 1.

An advantage of the tri-gate transistor 100 is that it exhibits good short channel effects (SCE). One reason tri-gate transistor 100 achieves good short channel effects is that the nonplanarity of the device places the gate electrode 108 in such a way as to surround the active channel region. That is, in the tri-gate device, the gate electrode 108 is in contact with three sides of the channel region. Unfortunately, the fourth side, the bottom part of the channel is isolated from the gate electrode by the buried oxide layer 103 and thus is not under close gate control.

DETAILED DESCRIPTION OF THE PRESENT INVENTION

The present invention is a novel nonplanar device with a thinned lower body portion and a method of fabrication. In the following description, numerous specific details are set forth in order to provide a thorough understanding of the present invention. In other instances, well known semiconductor processes and manufacturing techniques have not been described in particular detail in order to not unnecessarily obscure the present invention.

Embodiments of the present invention include a nonplanar or tri-gate transistor having a semiconductor body which is wrapped around on three sides by a gate dielectric layer and a gate electrode. In embodiments of the present invention, the bottom portion of the semiconductor body is made thinner than the top portion of the semiconductor body. Making the bottom portion of the semiconductor body thinner than the top portion increases the gate control over the bottom portion of the body resulting in better short channel effects. In an embodiment of the present invention, a semiconductor film is etched into a semiconductor body utilizing a dry etching process which utilizes a first process gas chemistry and a first RF bias. After forming the semiconductor body, the lower portion of the body is thinned utilizing the same etch chemistry and equipment but utilizing a lower RF bias in order to inwardly taper or facet the lower body portion.

Figure 1:
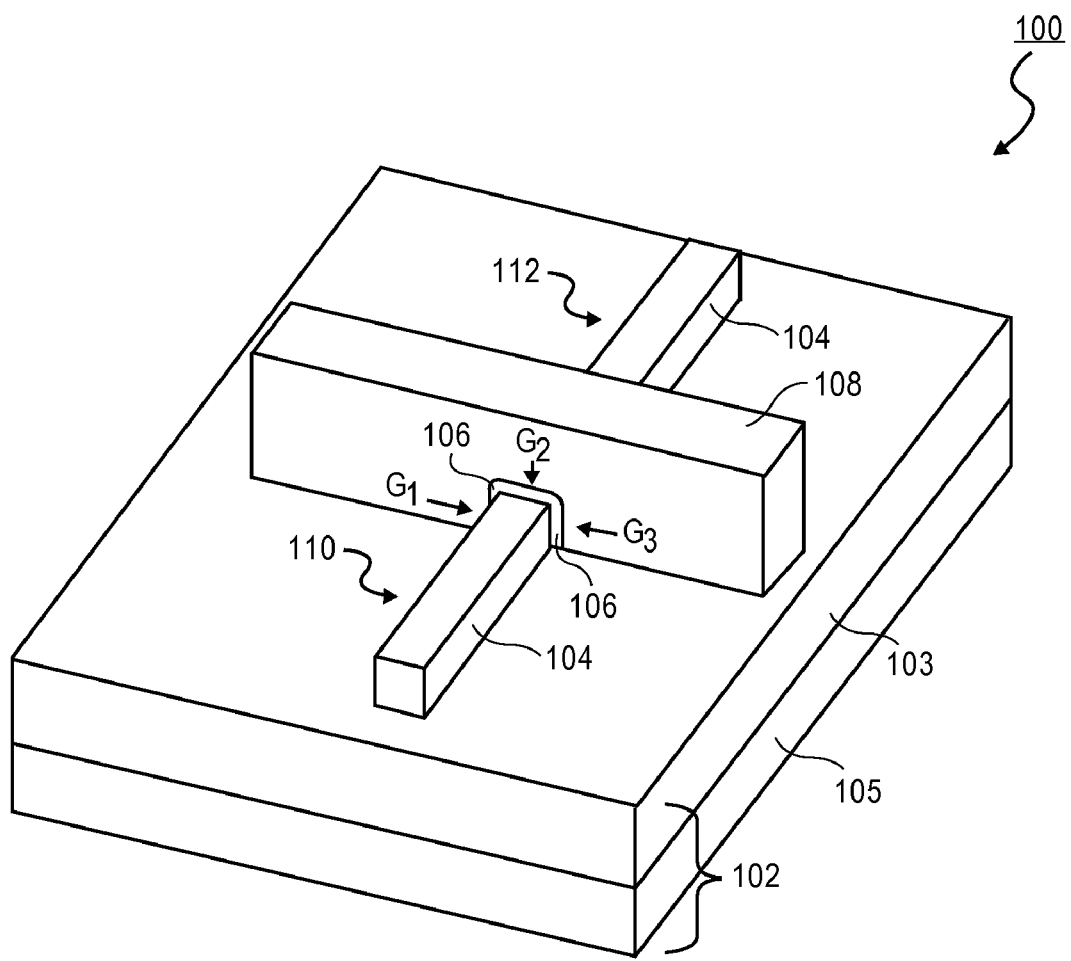
FIG. 1 is an illustration of a nonplanar or tri-gate device.
Figure 2A:
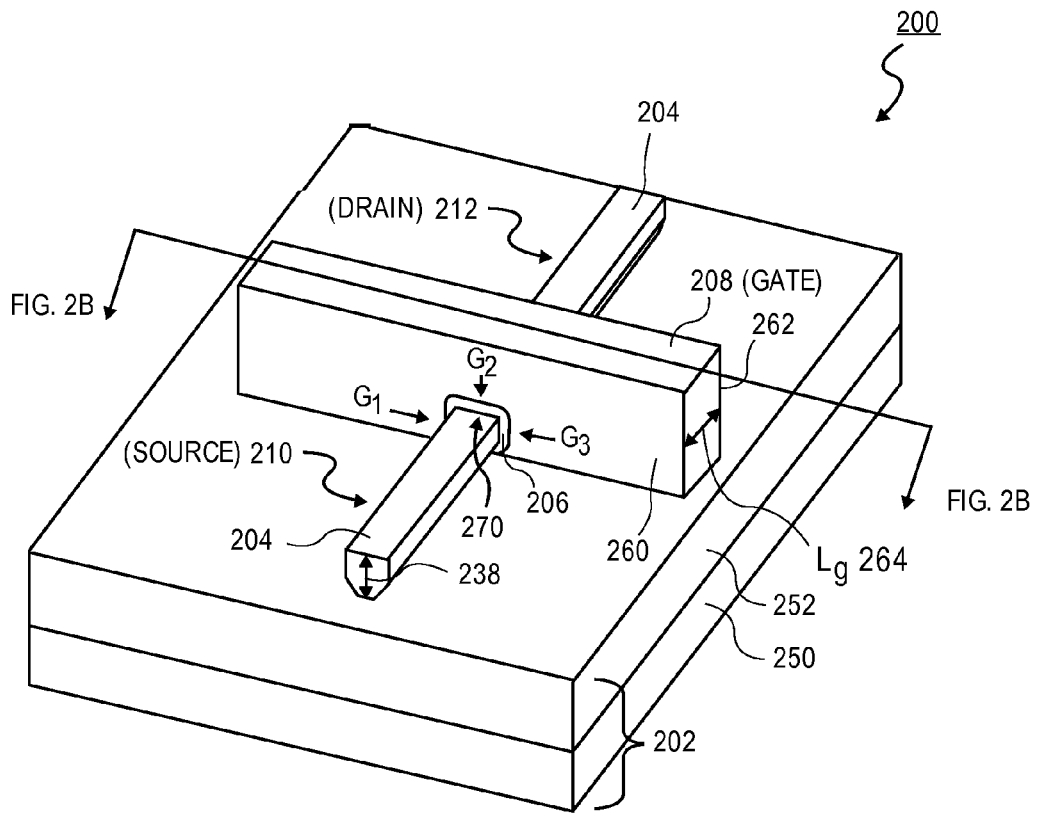
FIGS. 2A and 2B illustrate a tri-gate or nonplanar device with a thinned lower body portion in accordance with the present invention.
Figure 2B:
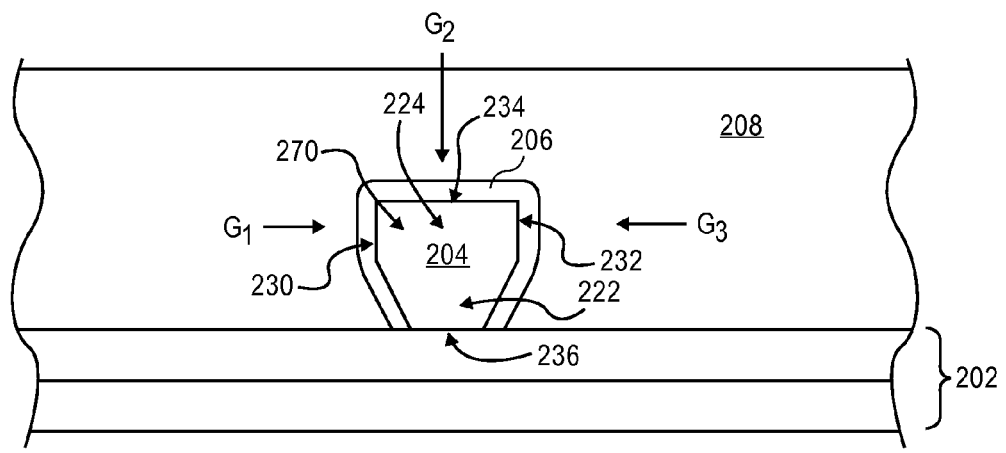

FIGS. 2A and 2B illustrate a nonplanar or tri-gate device 200 having a semiconductor body with a thinned lower body portion. FIG. 2A is an overhead/side view of transistor 200 while FIG. 2B is an illustration of a cross-sectional view taken through the gate electrode. Transistor 200 is formed on a substrate 202 and includes a semiconductor body or fin 204. A gate dielectric layer 206 is formed on the top surface 234 and sidewalls 230 and 232 of a semiconductor body 204. A gate electrode 208 is formed on the gate dielectric layer 206 and surrounds the semiconductor body or fin on three sides. A source regions 210 and a drain region 212 are formed in the semiconductor body on opposite sides of the gate electrode 208 as shown in FIG. 2A.

As is readily apparent from FIGS. 2A and 2B, the semiconductor body 204 has a bottom portion 222 which is thinner than the top portion 224. That is, the distance between the sidewalls 230 and 232 is greater at the top surface 234 than at the bottom surface 236. In an embodiment of the present invention, sidewalls 230 and 232 of the top portion 224 are substantially vertical and are spaced a uniform distance apart while the sidewalls 230 and 232 of the bottom portion 222, are faceted or inwardly tapered to reduce the distance between the sidewalls 230 and 232 in the bottom portion. In an embodiment of the present invention, the distance between the sidewalls 230 and 232 near the bottom surface is between ½ to ⅔ the distance between the sidewalls 230 and 232 near the top surface 234. In an embodiment of the present invention, the sidewalls 230 and 232 begin to taper inwardly at approximately the midpoint of the height 238 of the semiconductor body 204 (i.e., sidewalls start tapering inwardly at the midpoint between the top surface 234 and bottom surface 236). In an embodiment of the present invention, the distance between the sidewalls 230 and 232 at the top surface 234 is between 20-30 nanometers while the distance between the sidewalls 230 and 232 near the bottom surface 236 is between 10-15 nanometers. In an embodiment of the present invention, the bottom portion 222 of the semiconductor body 204 is made sufficiently thin so that the gate control of the bottom portion is made similar to the gate control of the top portion. In an embodiment of the present invention, the bottom portion 222 of the semiconductor body 204 is made sufficiently thin relative to the top portion to improve the short channel effects of transistor 200.

Figure 5A:
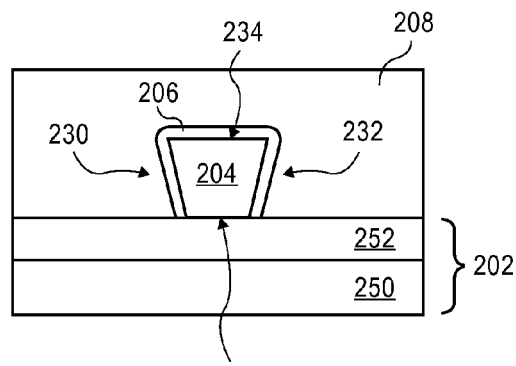
FIGS. 5A-5D illustrate other semiconductor body profiles or shapes.
Figure 5B:
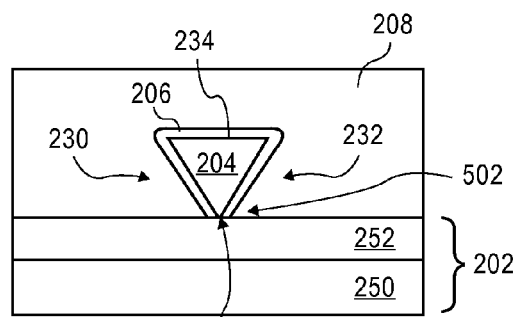
Figure 5C:
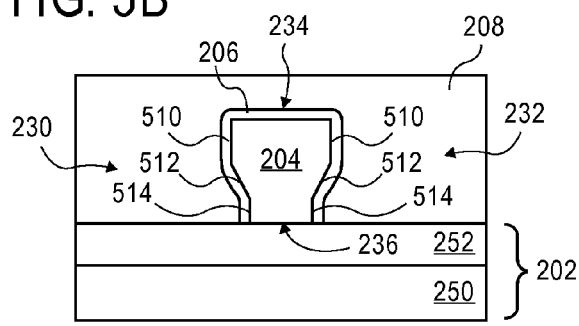
Figure 5D:
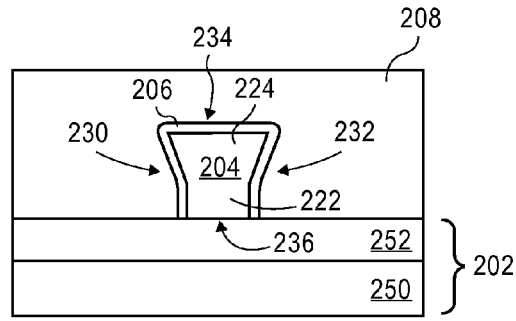

Additionally, as illustrated in FIGS. 5A-5D, other semiconductor body profiles or shapes may be utilized to improve the short channel effects (SCE) of the tri-gate or nonplanar transistor 200. For example, as illustrated in FIG. 5A, the semiconductor body 204 can have a pair of sidewalls 230 and 232 which continually taper inward from the top surface 234 to the bottom surface 236. Additionally, in an embodiment of the present invention, as illustrated in FIG. 5B the semiconductor body 204 can have sidewalls 230 and 232 which continually taper inward from the top surface to the bottom surface and reach the bottom surface 236 at a point or substantially at point 502. In yet another embodiment of the present invention as illustrated in FIG. 5C, the semiconductor body 204 can have a pair of sidewalls 230 and 232 which include an upper vertical portion 510 separated by uniform distance, a middle inwardly tapered portion 512 and a lower portion 514 of vertical sidewalls separated by a second distance which is less than the distance separating the top portion sidewalls 510. In yet another embodiment of the present invention, the semiconductor body can have an upper portion 224 where the sidewalls 230 and 232 are faceted or tapered inwardly and a bottom portion 222 where the sidewalls 230 and 232 are vertical or substantially vertical. In each of the example illustrated in FIGS. 5A-5D, the distance between the sidewalls 230 and 232 of semiconductor body 204 on the top surface is greater than the distance between the semiconductor body on the bottom surface. In this way, the gate electrode 208 can have better control of the semiconductor body at the bottom surface and thereby improve the short channel effects of the device.

In an embodiment of the present invention, the tri-gate transistor 200 is formed on an insulating substrate 202 which includes a lower monocrystalline silicon substrate 250 upon which is formed an insulating layer 252, such as a silicon dioxide film. In an embodiment of the present invention, insulating layer 252 is a buried oxide layer of an SOI substrate. The tri-gate transistor 200, however, can be formed on any well known insulating substrate, such as substrates formed from silicon dioxide, nitrides, oxides, and sapphires.

Semiconductor body 204 is formed on insulating layer 252 of insulating substrate 202. Semiconductor body 204 can be formed on any well known material, such as but not limited to silicon (Si), germanium (Ge), silicon germanium ($Si_xGe_y$), gallium arsenide (GaAs), InSb, GaP and GaSb. Semiconductor body 204 can be formed of any well known material which can be reversely altered from an insulating state to a conductive state by applying external electrical controls. Semiconductor body 204 is ideally a single crystalline film when best electrical performance of transistor 200 is desired. For example, semiconductor body 204 is a single crystalline film when transistor 200 is used in higher performance applications, such as high density circuit, such as a microprocessor. Semiconductor body 204, however, can be a polycrystalline film when transistor 200 is used in applications requiring less stringent performance, such as liquid crystal displays. Insulator 252 isolate semiconductor body 204 from the monocrystalline silicon substrate 250. In an embodiment of the present invention, semiconductor body 204 is a single crystalline silicon film.

Gate dielectric layer 206 is formed on and around three sides of semiconductor body 204 as shown in FIGS. 2A and 2B. Gate dielectric layer 206 is formed on or adjacent to sidewall 230, on the top surface 234 of body 204 and on or adjacent to sidewall 232 of body 204 as shown in FIGS. 2A and 2B. Gate dielectric layer 206 can be any well known gate dielectric layer. In an embodiment of the present invention, the gate dielectric layer is a silicon dioxide ($SiO_2$), silicon oxynitride ($SiO_xN_y$) or a silicon nitride ($Si_3N_4$) dielectric layer. In an embodiment of the present invention, the gate dielectric layer 206 is a silicon oxynitride film formed to a thickness between 5-20 Å. In an embodiment of the present invention, gate dielectric layer 206 is a high k gate dielectric layer, such as a metal oxide dielectric, such as but not limited to tantalum pentaoxide ($TaO_5$), titanium oxide ($TiO_2$) and hafnium oxide (HfO). Gate dielectric layer 206 can be other types of high k dielectric layers, such as but not limited to PZT and BST.

Gate electrode 208 is formed on and around gate dielectric layer 206 as shown in FIGS. 2A and 2B. Gate electrode 208 is formed on or adjacent to gate dielectric layer 206 formed on sidewall 230 of semiconductor body 204 is formed on gate dielectric layer 206 formed on the top surface 234 of semiconductor body 204 and is formed adjacent to or on gate dielectric layer 206 formed on sidewall 232 of semiconductor body 204. Gate electrode 208 has a pair of laterally opposite sidewalls 260 and 262 separated by a distance which defines the gate length (Lg) 264 of transistor 200. In an embodiment of the present invention, laterally opposite sidewalls 260 and 262 of gate electrode 208 run in a direction perpendicular to sidewalls 230 and 232 of semiconductor body 204.

Gate electrode 208 can be formed of any suitable gate electrode material. In an embodiment of the present invention, gate electrode 208 comprises a polycrystalline silicon film doped to a concentration density between $1 \times 10^{19}$ atoms/$cm^3$ to $1 \times 10^{20}$ atoms/$cm^3$. In an embodiment of the present invention, the gate electrode can be a metal gate electrode, such as but not limited to tungsten, tantalum, titanium and their nitrides. In an embodiment of the present invention, the gate electrode is formed from a material having a midgap workfunction between 4.5 to 4.8 eV. It is to be appreciated that gate electrode 208 need not necessarily be a single material and can be a composite stack of thin films, such as but not limited to polycrystalline silicon/metal electrode or metal/polycrystalline silicon electrode.

Transistor 200 has a source region 210 and a drain region 212. Source region 210 and drain region 212 are formed in semiconductor 204 on opposite sides of gate electrode 208 as shown in FIG. 2A. Source region 210 and drain region 212 are formed to an n type conductivity type when forming a NMOS transistor and are formed to a p type conductivity when forming a PMOS device. In an embodiment of the present invention, source region 210 and drain region 212 have a doping concentration between $1 \times 10^{19}$ atoms/$cm^3$ to $1 \times 10^{21}$ atoms/$cm^3$. Source region 210 and drain region 212 can be formed of the uniform concentration or can include subregions of different concentrations or dopant profiles, such as tip regions (e.g., source/drain extensions) and contact regions. In an embodiment of the present invention, when transistor 200 is a symmetrical transistor, source region 210 and drain region 212 have the same doping concentration and profile. In an embodiment of the present invention, when transistor 200 is formed as an asymmetrical transistor, then the doping concentration profile of the source region 210 and drain region 212 may vary in order to any particular electrical characteristics as well known in the art. Source region 210 and drain region 212 can be collectively referred to as a pair of source/drain regions.

The portion of semiconductor body 204 located between source region 210 and drain region 212, defines the channel region 270 of transistor 200. The channel region 270 can also be defined as the area of the semiconductor body 204 surrounded by the gate electrode 208. At times however, the source/drain region may extend slightly beneath the gate electrode through, for example, diffusion to define a channel region slightly smaller than the gate electrode length (Lg). In an embodiment of the present invention channel region 270 is intrinsic or undoped monocrystalline silicon. In an embodiment of the present invention, channel region 270 is doped monocrystalline silicon. When channel region 270 is doped it is typically doped to a conductivity level of between $1\times10^{16}$ to $1\times10^{19}$ atoms/cm$^3$. In an embodiment of the present invention, when the channel region is doped it is typically doped to the opposite conductivity type of the source region 210 and the drain region 212. For example, when the source and drain regions are n type conductivity the channel region would be doped to p type conductivity. Similarly, when the source and drain regions are p type conductivity the channel region would be n type conductivity. In this manner a tri-gate transistor 200 can be formed into either a NMOS transistor or a PMOS transistor respectively. Channel region 270 can be uniformly doped or can be doped non-uniformly or with differing concentrations to provide particular electrical and performance characteristics. For example, channel regions 270 can include well-known "halo" regions, if desired.

Figure 3A:
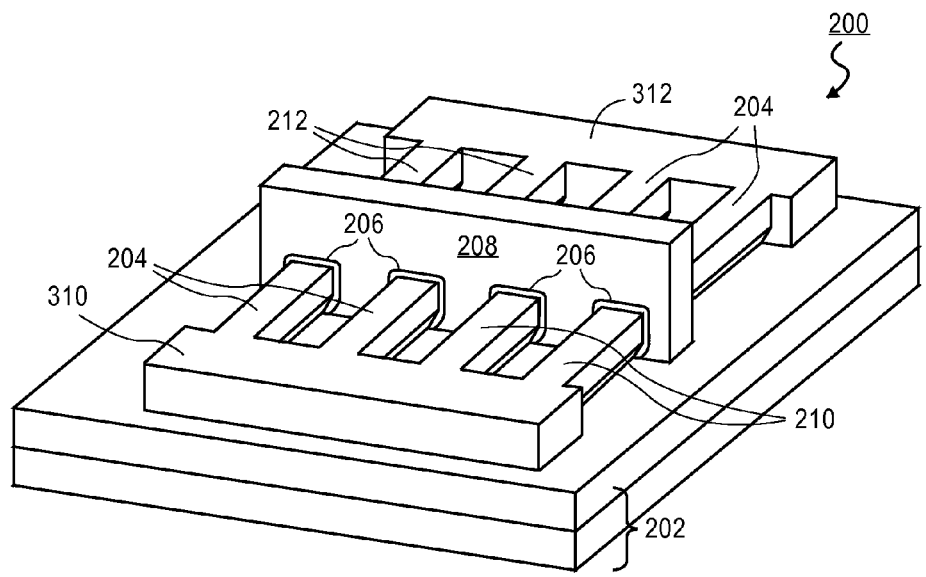
FIG. 3A illustrates a nonplanar device having multiple thinned lower body portions.

By providing a gate dielectric and a gate electrode which surrounds the semiconductor body on three sides, the tri-gate transistor is characterized in having three channels and three gates, one gate and channel ($G_1$ which extends between the source and drain regions on side 230 of silicon body 204, a second gate and channel ($G_2$) which extends between the source and drain regions on the top surface of silicon body 204, and a third gate and channel ($G_3$) which extends between the source and drain regions on the sidewall of silicon body 204. The gate "width" (Gw) of transistor 200 is the sum of the widths of the three channel regions. That is, the gate width of transistor 200 is equal to the length of sidewall 230 of silicon body 204, plus the length of top surface 234 of silicon body of 204, plus the length of sidewall 232 of silicon body 204. Larger "width" transistors can be obtained by using multiple devices coupled together (e.g., multiple silicon bodies 204 surrounded by a single gate electrode 208) as illustrated in FIG. 3A.

Because the channel region 270 is surrounded on three sides by gate electrode 208 and gate dielectric 206, transistor 200 can be operated in a fully depleted manner wherein when transistor 200 is turned "on" the channel region 270 fully depletes thereby providing the advantageous electrical characteristics and performance of a fully depleted transistor. That is, when transistor 200 is turned "ON" a depletion region is formed in channel region 270 along with an inversion layer at the surfaces of region 270 (i.e., an inversion layer is formed on the side surfaces and top surface of the semiconductor body). The inversion layer has the same conductivity type as the source and drain regions and forms a conductive channel between the source and drain regions to allow current to flow therebetween. The depletion region depletes free carriers from beneath the inversion layer. The depletion region extends to the bottom of channel region 270, thus the transistor can be said to be a "fully depleted" transistor. In embodiments of the present invention, the lower portion 222 of the semiconductor body 204 has been thinned relative to the upper portion so that the gate electrode can better control the lower portion of the semiconductor body. By thinning the lower portion, the two sidewall gates $G_1$ and $G_3$ can more easily deplete free carriers from beneath the inversion layer formed on the sidewalls of the lower portion of the semiconductor body 204. By thinning the lower portion 222 of semiconductor body 204, the two gates $G_1$ and $G_3$ from the sidewall can control the channel region in a manner similar to the way the three gates $G_1$, $G_2$ and $G_3$ control the channel in the upper portion 224 of the semiconductor body 204. Thinning the bottom part of the body or fin not only decreases the thickness of a semiconductor between the two gates, but also decreases the width of that part of the body which is in contact with the buried oxide. These effects combined decrease the short channel effects in the tri-gate device having a thinned lower body portion.

Transistor 200 of the present invention, can be said to be an nonplanar transistor because the inversion layer of channel 270 is formed in both the horizontal and vertical directions in semiconductor body 204. The semiconductor device of the present invention, can also be considered to be a nonplanar device because the electric field from gate electrode 208 is applied from both horizontal ($G_2$) and vertical sides ($G_1$ and $G_3$).

As stated above the gate width of transistor 200 is equal to the sum of the three gate widths created from semiconductor body 204 of transistor 200. In order to fabricate transistors with larger gate widths, transistor 200 can include additional or multiple semiconductor bodies or fins 204 as illustrated in FIG. 3A. Each semiconductor body or fin 204 has a gate dielectric layer 206 formed on its top surface and sidewalls as shown in FIG. 3A. Gate electrode 208 is formed on and adjacent to each gate dielectric layer 206 on each semiconductor body 204. Each semiconductor body 204 includes a source region 210 and drain region 212 formed in the semiconductor body 204 on opposite sides of gate electrode 208 as shown in FIG. 3A. In an embodiment of the present invention, each semiconductor body 208 is formed with same width and height (thickness) as other semiconductor bodies 204. In an embodiment of the present invention, each source region 210 and drain region 212 of the semiconductor bodies 204 are electrically coupled together by semiconductor material used to form semiconductor body 204 to form a source landing pad 310 and a drain landing pad 312 as shown in FIG. 3A. Alternatively, the source regions 210 and drain regions 212 can be coupled together by higher levels of metallization (e.g., metal 1, metal 2, metal 3) used to electrically interconnect various transistors 200 together in the functional circuits. The gate width of transistor 200 as shown in FIG. 3A would be equal to the sum of the gate width created by each of the semiconductor bodies 204. In this way, a nonplanar or tri-gate transistor 200 can be formed with any gate width desired. In an embodiment of the present invention, each of the semiconductor bodies 204 include a bottom portion 222 which is thinner than the top portion 224 as described above.

Figure 3B:
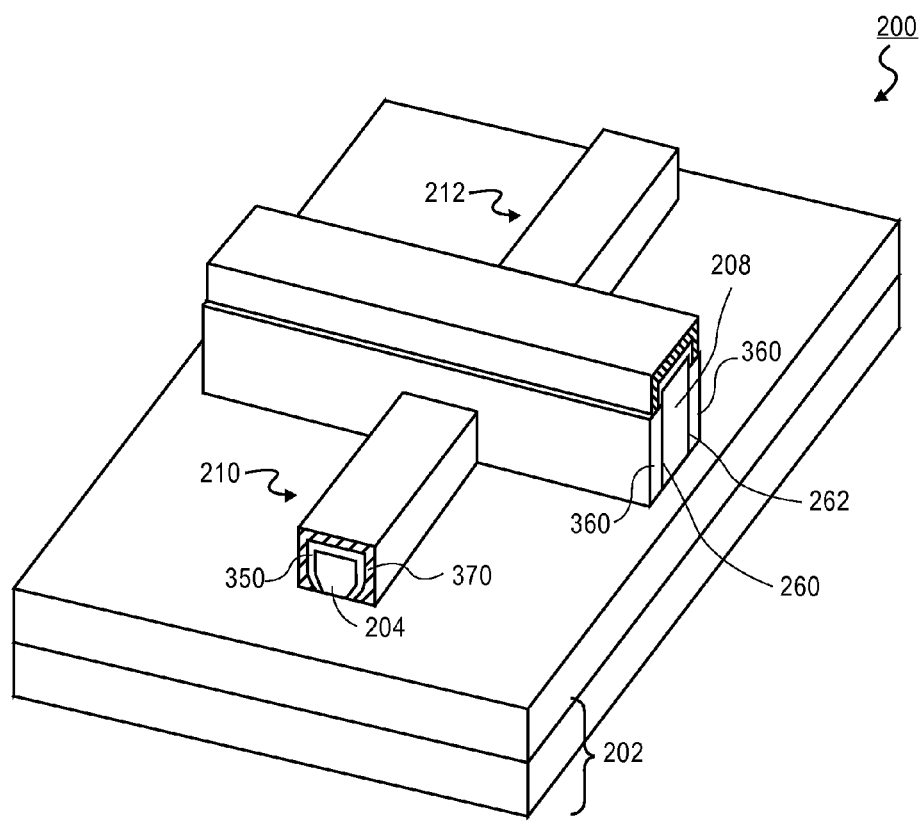
FIG. 3B is an illustration of a nonplanar device having a thinned lower body portion and including sidewall spacers, source/drain extensions and silicided source/drain regions.

In an embodiment of the present invention, the source 210 and drain 212 can include a silicon or other semiconductor film 350 formed on and around semiconductor body 204 as shown in FIG. 3B. For example, semiconductor film 350 can be a silicon film or silicon alloy, such as silicon germanium ($Si_xGe_y$). In an embodiment of the present invention, the semiconductor film 350 is a single crystalline silicon film formed of the same conductivity type as a source region 210 and drain region 212. In an embodiment of the present invention, the semiconductor film can be a silicon alloy, such as silicon germanium where silicon comprises approximately 1-99 atomic percent of the alloy. The semiconductor film 350 need not necessarily be a single crystalline semiconductor film and in embodiment can be a polycrystalline film. In an embodiment of the present invention, semiconductor film 350 is formed on the source region 210 and the drain region 212 of semiconductor body 204 to form "raised" source and drain regions. Semiconductor film 350 can be electrically isolated from a gate electrode 208 by a pair of dielectric sidewalls spacers 360, such as silicon nitride or silicon oxide or composites thereof. Sidewall spacers 360 run along laterally opposite sidewalls 260 and 262 of gate electrode 208 as shown in FIG. 3B thereby isolating the semiconductor film 350 from the gate electrode 208. In an embodiment of the present invention, sidewall spacer 360 have a thickness of between 20-200 Å. By adding a silicon or semiconductor film of the source and drain regions 210 and 212 of the semiconductor body and forming "raised" source and drain regions, the thickness of the source and drain regions is increased thereby reducing the source/drain contact resistance to transistor 200 improving its electrical characteristics and performance.

In an embodiment of the present invention, a silicide film 370, such as but not limited to titanium silicide, nickel silicide, cobalt silicide is formed on the source region 210 and drain region 212. In an embodiment of the present invention, silicide 370 is formed on silicon film 350 on semiconductor body 204 as shown in FIG. 3B. Silicide film 370, however, can be formed directly onto silicon body 204, if desired. Dielectric spacers 360 enables silicide 370 to be formed on semiconductor body 204 or silicon film 250 in a self-aligned process (i.e., a salicide process).

In an embodiment of the present invention, if desired, the silicon film 350 and/or the silicide film 370 can also be formed on the top of gate electrode 208 when gate electrode 208 is a silicon or silicon germanium film. The formation of silicon film 350 and silicide film 370 on the gate electrode 208 reduces the contact resistance of the gate electrode thereby improving the electrical performance of transistor 200.

Figure 4A:
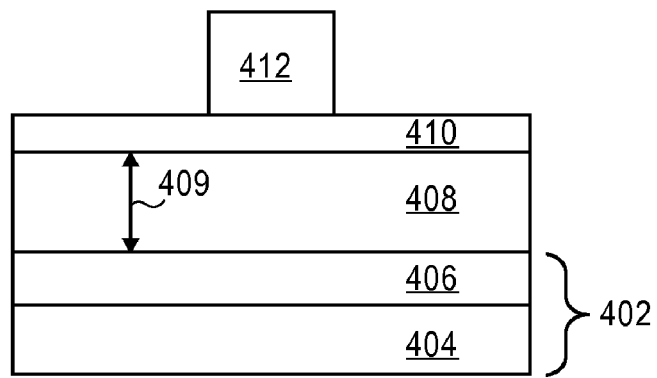
FIGS. 4A-4H illustrate a method of forming a nonplanar device with a thinned lower body portion in accordance with an embodiment of the present invention.

FIGS. 4A-4H illustrate a method of forming a nonplanar transistor having a thinned lower body portion. The fabrication of the transistor begins with substrate 402. A silicon or semiconductor film 408 is formed on substrate 402 as shown in FIG. 4A. In an embodiment of the present invention, the substrate 402 is an insulating substrate, such as shown in FIG. 4A. In an embodiment of the present invention, insulating substrate 402 includes a lower monocrystalline silicon substrate 404 and a top insulating layer 406, such as a silicon dioxide film or silicon nitride film. Insulating layer 406 isolates semiconductor film 408 from substrate 404, and in embodiment is formed to a thickness between 200-2000 Å. Insulating layer 406 is sometimes referred to as a "buried oxide" layer. When a silicon or semiconductor film 408 is formed on an insulating substrate 402, a silicon or semiconductor on insulating (SOI) substrate is created.

Although semiconductor film 408 is ideally a silicon film, in other embodiments it can be other types of semiconductor films, such as but not limited to germanium (Ge), a silicon germanium alloy ($Si_xGe_y$), gallium arsenide (GaAs), InSb, GaP and GaSb. In an embodiment of the present invention, semiconductor film 408 is an intrinsic (i.e., undoped) silicon film. In other embodiments, semiconductor film 408 is doped to a p type or n type conductivity with a concentration level between $1\times10^{16}$–$1\times10^{19}$ atoms/cm$^3$. Semiconductor film 408 can be insitu doped (i.e., doped while it is deposited) or doped after it is formed on substrate 402 by for example ion-implantation. Doping after formation enables both PMOS and NMOS tri-gate devices to be fabricated easily on the same insulating substrate. The doping level of the semiconductor body at this point can be used to set the doping level of the channel region of the device.

Semiconductor film 408 is formed to a thickness which is approximately equal to the height desired for the subsequently formed semiconductor body or bodies of the fabricated tri-gate transistor. In an embodiment of the present invention, semiconductor film 408 has a thickness or height 409 of less than 30 nanometers and ideally less than 20 nanometers. In an embodiment of the present invention, semiconductor film 408 is formed to the thickness approximately equal to the gate "length" desired of the fabricated tri-gate transistor. In an embodiment of the present invention, semi-conductor film 408 is formed thicker than desired gate length of the device. In an embodiment of the present invention, semiconductor film 480 is formed to a thickness which will enable the fabricated tri-gate transistor to be operated in a fully depleted manner for its designed gate length (Lg).

Semiconductor film 408 can be formed on insulating substrate 402 in any well-known method. In one method of forming a silicon on insulator substrate, known as the SIMOX technique, oxygen atoms are implanted at a high dose into a single crystalline silicon substrate and then anneal to form the buried oxide 406 within the substrate. The portion of the single crystalline silicon substrate above the buried oxide becomes the silicon film 408. Another technique currently used to form SOI substrates is an epitaxial silicon film transfer technique which is generally referred to as bonded SOI. In this technique a first silicon wafer has a thin oxide grown on its surface that will later serve as the buried oxide 406 in the SOI structure. Next, a high dose hydrogen implant is made into the first silicon wafer to form a high stress region below the silicon surface of the first wafer. This first wafer is then flipped over and bonded to the surface of a second silicon wafer. The first wafer is then cleaved along the high stress plain created by the hydrogen implant. This results in a SOI structure with a thin silicon layer on top, the buried oxide underneath all on top of the single crystalline silicon substrate. Well-known smoothing techniques, such as HCl smoothing or chemical mechanical polishing (CMP) can be used to smooth the top surface of semiconductor film 408 to its desired thickness.

At this time, if desired, isolation regions (not shown) can be formed into SOI substrate in order to isolate the various transistors to be formed therein from one another. Isolation regions can be formed by etching away portions of the substrate film 408 surrounding a tri-gate transistor, by for example well-known photolithographic and etching techniques, and then back filling the etched regions with an insulating film, such as $SiO_2$.

In an embodiment of the present invention, a hard mask material 410 formed on semiconductor film 408 as shown in FIG. 4A. Hard mask material 410 is a material which can provide a hard mask for the etching of the semiconductor film 408. A hard mask material is a material which can retain its profile during etching of the semiconductor film 408. A hard mask material 410 is a material which will not etch or only slightly etch during the etching of semiconductor film 408. In an embodiment of the present invention, the hard mask material is formed of a material such that the etchant used to etch the semiconductor film 408 will etch thin film 408 at least five times faster than the hard mask material and ideally at least ten times faster. In an embodiment of the present invention, when semiconductor film 408 is a silicon film, the hard mask material 410 can be a silicon nitride or silicon oxynitride film. Hard mask material 410 is formed to a thickness sufficient to retain its profile during the entire etch of semiconductor film 408 but not too thick to cause difficulty in its patterning. In an embodiment of the present invention, the hard mask material 410 is formed to a thickness between 3 nanometers to 20 nanometers and ideally to a thickness less than 10 nanometers.

Next, as also shown in FIG. 4A, a photoresist mask 412 is formed on hard mask layer 410. Photoresist mask 412 contains a feature pattern to be transferred into the semiconductor film 408. The photoresist mask 412 can be formed by any well known techniques, such as by blanket depositing a photoresist material by masking, exposing and developing the photoresist film into a photoresist mask 412 having a desired pattern for the semiconductor film 408 to be patterned. Photoresist mask 412 is typically formed of an organic compound. Photoresist mask 412 is formed to a thickness sufficient to retain its profile while patterning the hard mask film 410 but yet is not formed to thick to prevent lithographic patterning into the smallest dimensions (i.e., critical dimensions) possible with photolithography system and process used.

Figure 4B:
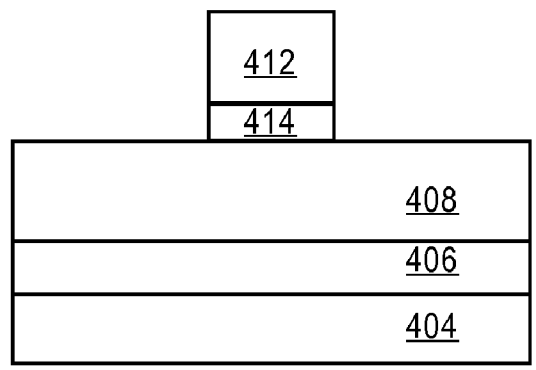

Next, as shown in FIG. 4B, the hard mask material 410 is etched in alignment with photoresist mask 412 to form a hard mask 414 as shown in FIG. 4B. Photoresist mask 412 prevents the underlying portion of hard mask material 410 from becoming etched. In an embodiment of the present invention, the hard mask is etched with an etchant which can etch the hard mask material but does not etch the underlying semiconductor film 208. The hard mask material is etched with an etchant that has almost perfect selectivity to the underlying semiconductor film 208. That is, in an embodiment of the present invention, the hard mask etchant etches the hard mask material at least one hundred times faster than the underlying semiconductor film 208 (i.e., an etchant has a hard mask to semiconductor film selectivity of at least 50:1). When the hard mask material 414 is a silicon nitride or silicon oxynitride film, hard mask material 410 can be etched into a hard mask 414 utilizing a dry etch process, such as a reactive ion etching/ecr plasma etching. In an embodiment of the present invention, a silicon nitride or silicon oxynitride hard mask is reactive ion etched utilizing chemistry comprising $CHF_3$ and $O_2$ and $Ar/CH_2F_2$ and $C_4F_8$ and Ar and $O_2$.

Figure 4C:
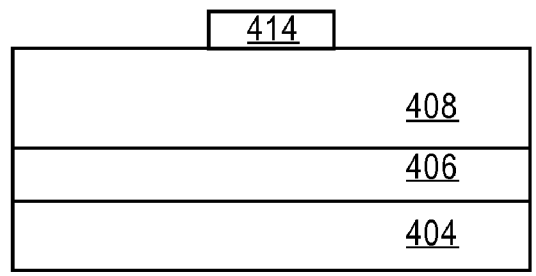

Next, as shown in FIG. 4C, after hard mask film 410 has been patterned into a hard mask 414, photoresist mask 412 can be removed by well known techniques. For example, photoresist mask 412 can be removed utilizing a "piranha" clean solution which includes sulfuric acid and hydrogen peroxide. Additionally, residue from photoresist mask 412 can be removed with an $O_2$ ashing.

Although not required, it is desirable to remove photoresist mask 412 prior to etching semiconductor film 408 so that a polymer film from the photoresist does not form on the sidewalls of the patterned semiconductor film 408. It is desirable to first remove the photoresist mask 412 prior to etching of the semiconductor film 408 because dry etching processes can erode the photoresist mask and cause a polymer film to develop on the sidewalls of the semiconductor body which can be hard to remove and which can detrimentally device performance. By first removing the photoresist film 412 prior to patterning the semiconductor thin film 408, the semiconductor thin film 408 can be patterned and pristine sidewalls maintained.

Figure 4D:
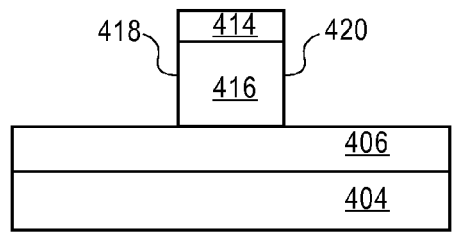

Next, as shown in FIG. 4D, semiconductor film 408 is etched in alignment with hard mask 414 to form a semiconductor body 416 having a pair of laterally opposite sidewalls 418 and 420. Hard mask 414 prevents the underlying portion of semiconductor film 208 from becoming etched during the etching process. The etch is continued until the underlying insulating substrate is reached. In an embodiment of the present invention, the etch "end points" on the buried oxide layer 406. Semiconductor film 208 etched with an etchant which etches semiconductor 208 without significantly etching hard mask 414. In an embodiment of the present invention, semiconductor film 408 is anisotropically etched so that semiconductor body 416 has nearly vertical sidewalls 418 and 420 formed in alignment with the sidewalls of hard mask 414 thereby providing an almost perfect fidelity with hard mask 414. When hard mask 414 is a silicon nitride or silicon oxynitride hard mask and semiconductor film 408 is a silicon film, silicon film 408 can be etched utilizing a dry etch process comprising $HBr/Ar/O_2$.

In an embodiment of the present invention, semiconductor body 408 is etched utilizing an electron cyclotron residence (ECR) plasma etcher. In an embodiment of the present invention, an ECR plasma etcher using a chemistry comprising $HBr/O2$ with a pressure between 0.2 to 0.8 pascal and the RF power of approximately 120 watts is used to etch a silicon thin film 408 into a silicon body 416. Such an etch process produces a substantially anisotropic etch to provide substantially vertical sidewalls 418 and 420 as shown in FIG. 4D. Additionally, such an etch has a high selectivity (approximately 20:1) to the buried oxide layer 406 so that the buried oxide layer etches very little and can be used as an etch stop and for end point detection. The ability to end point detect is important to insure that all of the semiconductor film clears from the buried oxide layer because the thickness 409 of the thin film across the wafer may vary and the etch rate of different width semiconductor bodies may also vary. In an embodiment of the present invention, an RF bias of between 100-120 watts is used. The RF bias controls the electron energy in the etch which in turn controls the anisotropic profile of the etch.

Figure 4E:
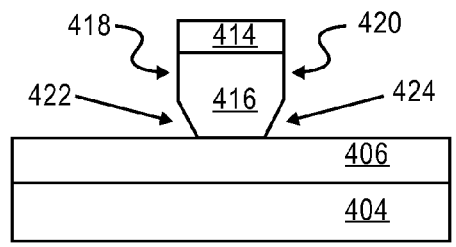
Figure 4F:
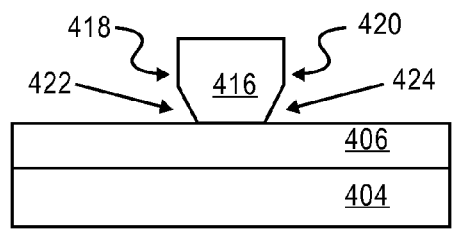

Next, as shown in FIG. 4F, the semiconductor body 416 is etched so as the reduce the distance between the sidewalls 418 and 420 in the lower portion of the semiconductor body 416. The etching of a semiconductor body to thin the lower portion of the semiconductor body can be referred to as the "profile" etch. In an embodiment of the present invention, the profile etch is utilized to inwardly taper or form facets 422 and 424 on the sidewalls 418 and 420 as illustrated in FIG. 4E. It is to be appreciated that in other embodiments of the present invention, the profile etch can thin the lower body portion as illustrated in FIGS. 5A-5D. In an embodiment of the present invention, a plasma etch process which produces an isotropic etch is utilized to reduce the distance between the sidewalls in lower portion of the semiconductor body as compared to the upper portion of the semiconductor body. In an embodiment of the present invention, the same plasma etch equipment and etch chemistry is used during the profile etch as is used during the patterning of the semiconductor film 408 except that the RF bias is decreased so that the vertical directionality of the ions is reduced. In an embodiment of the present invention, when semiconductor body 416 is a silicon body, the profile etch can be accomplished utilizing an ECR plasma etcher with a chemistry comprising $HBr/O2$ and a pressure between 0.2 to 0.8 pascal with an RF bias between 50-70 watts.

Next, as also shown in FIG. 4F, the hard mask 414 is removed from semiconductor body 416 having a thinned lower body portion. In an embodiment of the present invention, when hard mask 414 is a silicon nitride or silicon oxynitride film, a wet chemistry comprising phosphoric acid and Di water can be used to remove the hard mask. In an embodiment of the present invention, the hard mask etch comprises between 80-90% phosphoric acid (by volume) and Di water heated to a temperature between 150-170° C. and ideally to 160° C. is used. Such an etchant will have an almost perfect selectivity between the silicon nitride hard mask 214 and buried oxide layer 406.

Next, if desired, after removing hard mask 414 as illustrated in FIG. 4F, semiconductor body 416 can be exposed to a wet etchant to clean the body 416. In an embodiment of the present invention, a silicon body 416 is exposed to a wet etchant comprising ammonia hydroxide ($NH_4OH$) to remove any line edge roughness or pitting which may have developed during the patterning of the silicon body 416. In an embodiment of the present invention, a silicon body 416 is exposed for a period of time of between 30 seconds to 2 minutes to an etchant comprising between 0.1-1% of ammonia hydroxide by volume at a temperature between 20-30 degrees Celsius in order to provide a semiconductor body 416 with pristine sidewalls 418 and 420.

Figure 4G:
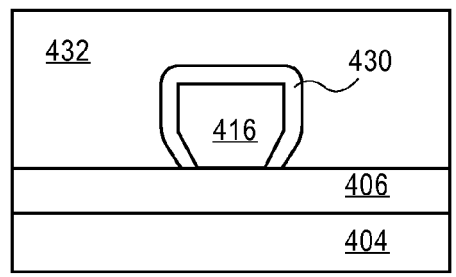

Next, as illustrated in FIG. 4G, a gate dielectric layer 430 is formed on sidewalls 418 and 420 and the top surface of semiconductor body 416. The gate dielectric layer can be a deposited dielectric or a grown dielectric. In an embodiment of the present invention, the gate dielectric layer 426 is a silicon oxynitride dielectric film grown by a dry/wet oxidation process. In an embodiment of the present invention, the silicon oxide film is grown to a thickness between 5-15 Å. In an embodiment of the present invention, the gate dielectric layer 430 is a deposited dielectric, such as but not limited to a high dielectric constant film, such as a metal oxide dielectric, such as tantalum pentaoxide ($Ta_2O_5$), titanium oxide ($TiO_2$), hafnium oxide, zirconium oxide, and aluminum oxide. Additionally, in an embodiment of the present invention, gate dielectric layer 430 can be other high k dielectric films, such as but limited to PZT and BST. Any well known technique can be utilized to deposit a high k dielectric, such as but not limited to chemical vapor deposition, atomic layer deposition and sputtering.

Next, gate electrode 432 is formed on the gate dielectric layer 430 formed on the top surface of semiconductor body 416 and is formed on or adjacent to the gate dielectric layer 430 formed on or adjacent to sidewalls 418 and 420 as shown in FIG. 4G. The gate electrode 432 has a top surface opposite a bottom surface formed on insulating layer 406 and has a pair of laterally opposite sidewalls 434 and 436 which define the gate length of the device. Gate electrode 432 can be formed by blanket depositing a suitable gate electrode material over the substrate and then patterning the gate electrode material with well known photolithograph and etching techniques to form a gate electrode 432 from the gate electrode material. In an embodiment of the present invention, the gate electrode material comprises polycrystalline silicon. In another embodiment of the present invention, the gate electrode material comprises a polycrystalline silicon germanium alloy. In yet other embodiments of the present invention, the gate electrode material can comprise a metal film, such as but not limited to tungsten, tantalum and their nitrides. In an embodiment of the present invention, the photolithography process used to find the gate electrode 432 utilizes the minimum or smallest dimension lithography process used to fabricate the nonplanar transistor (that is, in an embodiment of the present invention, the gate length (Lg) of the gate electrode 432 has a minimum feature dimension of the transistor defined by photolithography). In an embodiment of the present invention, the gate length is less than or equal to 30 nanometers and ideally less than 20 nanometers. It is to be appreciated that although the gate dielectric layer and gate electrode, as illustrated in FIGS. 4G and 4H, are formed with a "subtractive" process whereby undesired portions are etched away, the gate electrode can be formed with a replacement gate process whereby a sacrificial gate electrode is first formed, an interlayer dielectric formed adjacent thereto, the sacrificial gate electrode then removed to form an opening in which the gate electrode is then formed as is well known in the art.

Figure 4H:
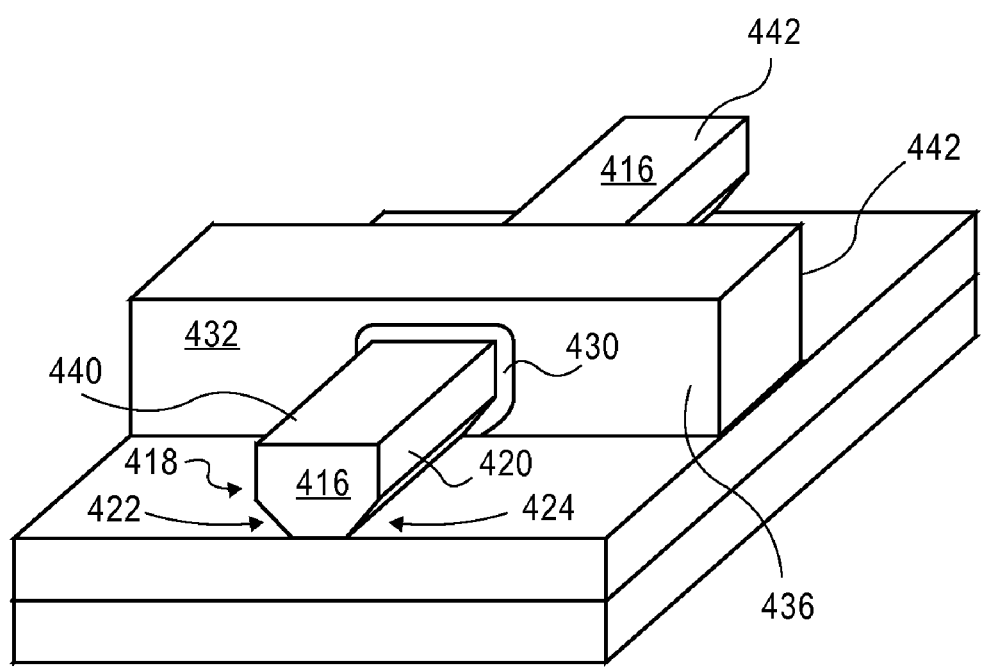

Next, as shown in FIG. 4H, a source region 440 and a drain region 442 are then formed in the semiconductor body 416 on opposite sides of gate electrode 432. For a PMOS transistor, the semiconductor body are doped to a p type conductivity with a concentration between $1 \times 10^{20}$ to $1 \times 10^{21}$ atoms/$cm^3$. For an NMOS nonplanar transistor, the semiconductor body 416 is doped with n type conductivity to a concentration between $1 \times 10^{20}$ to $1 \times 10^{21}$ atoms/$cm^3$ to form the source/drain regions. In an embodiment of the present invention, the source/drain regions can be formed by ion implantation. In an embodiment of the present invention, the ion implantation occurs in a vertical direction (i.e., a direction perpendicular to the substrate) as shown in FIG. 4H. The gate electrode 432 is a polysilicon gate electrode and can be doped during the ion implantation process. The gate electrode 432 acts as a mask to prevent the ion implantation step from doping the channel region of the nonplanar transistor. Again, the channel region is a portion of the semiconductor body 416 located beneath or surrounded by the gate electrode 432. If the gate electrode 432 is a metal electrode a dielectric hard mask can be used to block the doping during ion implantation process. In other embodiments or other methods, such as solid source diffusion may be used to dope the semiconductor body to form the source and drain regions. In embodiments of the present invention, the source/drain regions may also include subregions, such as source/drain extensions and source/drain contact regions. In such a case, the semiconductor body 416 would be doped on either side of the gate electrode 432 to form the source/drain extensions and then a pair of sidewall spacers such as illustrated in FIG. 3B would be formed along the sidewalls of the gate electrode and a second doping step utilized to form heavily doped source/drain contact region as is well known in the art. Additionally, if desired at this time, additional silicon and/or silicide can be formed onto the semiconductor bodies 416 to form raised source/drain regions and reduce the contact resistance of the device. This completes the fabrication of a nonplanar device having a semiconductor body with a thinned lower portion to improve device performance.

We claim:

1. A semiconductor device comprising:
    a semiconductor body formed on an insulating layer of a substrate, said semiconductor body having a top surface opposite a bottom surface formed on said insulating layer and a pair of laterally opposite sidewalls extending between said top surface and said bottom surface wherein the laterally opposite sidewalls include a tapered portion that extends from the top surface to the bottom surface of the semiconductor body such that the distance between said laterally opposite sidewalls at said top surface is greater than at said bottom surface;
    a gate dielectric layer formed on and in direct contact with said top surface and said sidewalls of said semiconductor body from said top surface to said bottom surface;
    a gate electrode formed on said gate dielectric layer on said top surface and sidewalls of said semiconductor body; and
    a pair of source/drain region formed in said semiconductor body on opposite sides of said gate electrode.

2. The semiconductor device of claim 1 wherein said distance between said sidewalls at the bottom surface of said semiconductor body is approximately ½ to ⅔ of the distance between said sidewalls at the top surface of said semiconductor body.

3. The semiconductor device of claim 1 wherein the distance between said sidewalls at the bottom portion of said semiconductor body is made sufficiently small so as to improve the short channel effects of said transistor.

4. The semiconductor device of claim 1 wherein the distance between said laterally opposite sidewalls at said top surface of said semiconductor body is approximately 20-30 nm.

5. The semiconductor device of claim 1 wherein the distance between said laterally opposite sidewalls near said bottom portion of said semiconductor body is approximately 10-15 nm.

6. The semiconductor device of claim 1 wherein the tapered portion that extends from the top surface to the bottom surface of the semiconductor body is a facet.

7. The semiconductor device of claim 1 wherein said semiconductor body comprises silicon.

8. The semiconductor device of claim 1 wherein the distance between said sidewalls near the bottom surface of said semiconductor body is approximately 50-66% of the distance between said sidewalls at the top of said semiconductor body.

9. The semiconductor device of claim 1 wherein the composition of said gate dielectric layer formed on said top surface is the same composition as said gate dielectric layer formed on said sidewalls.

10. The semiconductor device of claim 1 wherein said gate dielectric layer is a continuous gate dielectric layer formed on and in direct contact with said top surface and said sidewalls of said semiconductor body.

* * * * *